(12) United States Patent
Ker et al.

(10) Patent No.: US 6,521,952 B1
(45) Date of Patent: Feb. 18, 2003

(54) METHOD OF FORMING A SILICON CONTROLLED RECTIFIER DEVICES IN SOI CMOS PROCESS FOR ON-CHIP ESD PROTECTION

(75) Inventors: Ming-Dou Ker, Hsin-Chu (TW); Kei-Kang Hung, Chang-Hua Hsien (TW); Tien-Hao Tang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,811

(22) Filed: Oct. 22, 2001

(51) Int. Cl.[7] .............................................. H01L 23/62
(52) U.S. Cl. ..................... 257/360; 257/350; 257/141; 257/162; 257/173
(58) Field of Search ................................ 257/360, 141, 257/162, 173, 350

(56) References Cited

U.S. PATENT DOCUMENTS 5,959,820 A  * 9/1999 Ker et al. .................... 361/111
6,015,992 A  * 1/2000 Chatterjee et al. .......... 257/109

* cited by examiner

Primary Examiner—Jerome Jackson
(74) Attorney, Agent, or Firm—Winston Hsu

(57) ABSTRACT

An NMOS-trigger silicon controlled rectifier in silicon-on-insulator (SOI-NSCR) SOI-NSCR includes a P-type well and an N-type well. A first $P^+$ doping region and a first $N^+$ doping region are in the N-type well and form the anode of the SOI-NSCR. A second $P^+$ doping region and a second $N^+$ doping region are in the P-type well and form the cathode of the SOI-NSCR. The first $P^+$ doping region, the N-type well, the P-type well and the second $N^+$ doping region form a lateral SCR. A third $N^+$ doping region is across the N-type well and the P-type well. A gate is in the P-type well, and the third $N^+$ doping region, the gate and the second $N^+$ doping region form an NMOS. A dummy gate is in the N-type well for isolating the first $P^+$ doping region and the third $N^+$ doping region. When a voltage is applied to the gate of the NMOS that turns on the NMOS, a forward bias is created from the N-type well to the P-type well that turns on the SOI-NSCR. When a voltage is applied to the third $N^+$ doping region, a trigger current is generated that causes the lateral SCR to enter a latch state and so the SOI-NSCR is quickly turned on. Utilizing similar and related designs, the present invention discloses a PMOS-trigger silicon controlled rectifier in silicon-on-insulator (SOI-PSCR), and ESD protection circuitry utilizing the SOI-NSCR and the SOI-PSCR.

43 Claims, 16 Drawing Sheets

METHOD OF FORMING A SILICON CONTROLLED RECTIFIER DEVICES IN SOI CMOS PROCESS FOR ON-CHIP ESD PROTECTION

BACKGROUND OF INVENTION

1. Field of the Invention

The present invention relates in general to electrostatic discharge (ESD) protection for integrated circuits, and especially to silicon controlled rectifier (SCR) structures fabricated in SOI technology for providing electrostatic discharge protection to integrated circuits.

2. Description of the Prior Art

Recent advances in integrated circuits have included the further development of silicon-on-insulator (SOI) technology, in which an insulator layer is embedded within a substrate and extends beneath the active regions of an integrated circuit. There are many advantages in SOI devices, including nearly perfect sub-threshold swing, latch-up free operation, low off-state leakage, low operating voltage, and high current driving ability. But, electrostatic discharge (ESD) presents an issue due to bad thermal conductivity of the buried oxide and its floating body effect.

ESD often causes damage to semiconductor devices on an integrated circuit during handling of the IC package. An electrostatic discharge often has an extremely high voltage that easily destroys the thin gate oxide of devices in CMOS IC's. To prevent such ESD damage, the on-chip ESD protection circuits are typically incorporated into the chip of the integrated circuit. In general, such protection circuits include a switch that can be turned on and that is capable of conducting relatively large currents during an ESD event, but which stays turned off when the IC is under normal operating conditions. SCR devices typically have low holding voltages ($V_{hold}$~1V) in bulk (non-epitaxial) CMOS processes.

The power dissipation (power≈$I_{esd}$*$V_{hold}$) of the SCR device during ESD-related stress is thus less than that for other ESD protection devices (such as diodes, MOS's, BJT's or field-oxide devices) in CMOS technology. Therefore, SCR devices can sustain a much higher ESD level within a smaller layout area in CMOS IC's, and have been used as the main ESD clamping devices in ESD protection circuitry.

Since SCR devices have a switching voltage that exceeds 30 volts in sub-micron CMOS processes, they are not suitable for protecting the gate oxides in sub-micron CMOS technology, which typically have a breakdown voltage of less than 20 volts. Additional secondary protection circuits are often added into an on-chip ESD protection circuit that uses a SCR device to provide the overall ESD protection functionality for the IC. In order to improve the protection efficiency of SCR devices, several modified designs have been disclosed that use SCR devices in on-chip ESD protection circuitry.

In U.S. Pat. No. 5,012,317, a SCR device realized in a P-substrate/N-well CMOS process is proposed. Please refer to FIG. 1. FIG. 1 is a cross-sectional schematic diagram of a SCR device 10 realized in a P-substrate/N-well CMOS process according to the prior art. As shown in FIG. 1, the SCR device 10 is made in a silicon substrate. The silicon substrate comprises a P-type substrate 11 and an N well 12 in the P-type substrate 11, a P$^+$ region 14 in the N well 12 for use as an anode of the SCR device 10 (the input terminal of the SCR device 10), and an N$^+$ region 15 in the P-type substrate 11 for use as a cathode of the SCR device 10 (the ground terminal of the SCR device 10). The P$^+$ region 14, the N well 12, the P-type substrate 11 and the N$^+$ region 15 form the SCR device 10. Such a SCR device is triggered on by the junction breakdown across the P-type substrate/N well junction. When the SCR device 10 is triggered on, ESD current flows from the P$^+$ region 14, through the N well 12, through the P-type substrate 11, through the N$^+$ region 15, and then to ground for discharging. As described above, such a SCR device often has a high switching voltage (greater than 30V in a 0.35 μm CMOS process). With a higher switching voltage, the SCR device 10 needs an additional secondary protection circuit to provide the overall ESD protection functionality to the IC.

In U.S. Pat. No. 5,225,702, a modified design for a SCR device is proposed. Please refer to FIG. 2. FIG. 2 is a cross-sectional schematic diagram of a modified design of a SCR device 20 according to the prior art. As shown in FIG. 2, the modified SCR device 20 is made on a silicon substrate. The silicon substrate comprises a P-type substrate 21 with an N well 22 in the P-type substrate 21, a P$^+$ region 24 in the N well 22 for electrically connecting to the anode, which is normally the input terminal, an N$^+$ region 25 in the P-type substrate 21 for electrically connecting to the cathode, which is normally the ground terminal, and an N$^+$ diffusion region 26 that is added across the P-type substrate/N well junction. The P$^+$ region 24, the N well 22, the P-type substrate 21, the N$^+$ region 25, and the additional N$^+$ diffusion region 26 together form the modified SCR device 20. With the inserted N$^+$ diffusion region 26, the switching voltage of this SCR 20 is reduced to the breakdown voltage across the N$^+$ diffusion region/P-type substrate junction. Such a modified SCR device 20 typically has a switching voltage of about 12V for a 0.35 μm CMOS process. With a lower switching voltage, the SCR device 20 can be triggered on more quickly to discharge ESD current.

In U.S. Pat. No. 5,453,384, another modification of a SCR device is proposed, with an NMOS device added across the P-type substrate/N well junction. Please refer to FIG. 3. FIG. 3 is a cross-sectional schematic diagram of a second modified design of a SCR device 30 according to the prior art. As shown in FIG. 3, the SCR device 30 is made on a silicon substrate. The silicon substrate comprises a P-type substrate 31 with an N well 32 in the P-type substrate 31, a P$^+$ region 34 in the N well 32 for electrically connecting to the anode, which is normally the input terminal, an N$^+$ region 35 in the P-type substrate 31 for electrically connecting to the cathode, which is normally the ground terminal, and an N$^+$ diffusion region 36 across the N well 32 and the P-type substrate 31. The P$^+$ region 34, the N well 32, the P-type substrate 31, and the N$^+$ region 35 form the second modified design of the SCR device 30.

Compared to the previously described design for the SCR device 20, the SCR device 30 further comprises a gate insulator 37 together with a gate 38, which are formed between the N$^+$ diffusion region 36 and the N$^+$ region 35. Both a spacer 39 and a lightly doped drain 40 (in the P-type substrate 31) are formed on either side of the gate 38. An additional NMOS device 42 is thereby formed. In FIG. 3, shallow-trench-isolation (STI) regions 44 are also indicated in the structure of the SCR device 30 to indicate that such a SCR device 30 is formed using deep-submicron CMOS processes. With the additional NMOS device 42, the switching voltage of the SCR device 30 is reduced to the drain breakdown voltage of the inserted NMOS device 42 across the P-type substrate/N well junction. The SCR device 30 typically has a switching voltage of about 8V in 0.35 μm CMOS processes. With a sufficiently lowered switching voltage, the SCR device 30 can protect an IC in a standalone configuration without the need for extra secondary protection circuits.

Continuous advances in silicon-on-insulator (SOI) techniques are being made, which brings eminent progress to IC process. The SOI technique involves the formation of an insulator layer (a buried oxide layer) in the substrate, which extends beneath the active doping region of the integrated circuit. SOI devices have many advantages, such as nearly perfect sub-threshold swing, latch-up free operation, a low off-state leakage, a low operating voltage, and high current driving capabilities. However, due to the poor thermal conductivity of the buried oxide layer, and its floating body effect, IC products manufactured with the SOI technique have more severe problems as regards reliability.

When utilizing the SOI technique, the p-n-p-n path of a SCR device is blocked by the buried oxide region or the STI region of the SOI CMOS process. Consequently, in U.S. Pat. No. 6,015,992, a bi-stable SCR-like device has been proposed. Please refer to FIG. 4.

FIG. 4 is a cross-sectional schematic diagram of a bi-stable SCR-like device 50 according to the prior art. As shown in FIG. 4, the SOI substrate comprises a substrate 60, a buried oxide layer 46 and a single crystal silicon layer 66. Two additional connection lines (line 52 and line 54) are present in the bi-stable SCR-like 50, which are used to connect the separated npn 56 and pnp 58 BJT to form a SCR-like device. The active doping regions 57, 59 are separated by a field oxide layer 63. One difference between a conventional SCR and the SCR-like bi-stable switch 50 is that the npn 56 and pnp 58 BJT must be formed in separate and isolated active regions, and therefore require an interconnect layer to form the entire SCR-like device. For this reason, this is not a true SCR device.

It is thus important to develop a novel SCR structures so as to realize a SCR device in SOI CMOS processes.

SUMMARY OF INVENTION

It is therefore a primary objective of the present invention to provide an NMOS-trigger silicon controlled rectifier for silicon-on-insulator (SOI-NSCR), and a PMOS-trigger silicon controlled rectifier for silicon-on-insulator (SOI-PSCR). Further, electrostatic discharge protection circuits utilizing the SOI-NSCR and SOI-PSCR are described.

It is yet another objective of the present invention to realize a silicon controlled rectifier in silicon-on-insulator that has a compact structure and a quick turn-on speed.

In the first preferred embodiment of the present invention, a SOI-NSCR comprises a P-type well and an N-type well in a single crystal silicon layer on the surface of a silicon-on-insulator substrate. A first P$^+$ region and a first N$^+$ region are in the N-type well for electrically connecting to the anode. A second P$^+$ region and a second N$^+$ region are in the P-type well for electrically connecting to the cathode. The first P$^+$ region, the N-type well, the P-type well and the second N$^+$ region form a lateral SCR. A third N$^+$ region is across the N-type well and the P-type well and a gate is in the P-type well. The third N$^+$ region, the gate and the second N$^+$ region form an NMOS. A dummy gate is in the N-type well for isolating the first P$^+$ region and the third N$^+$ region. When a voltage is applied to the gate of the NMOS that turns on the NMOS, a forward bias is generated from the N-type well to the P-type well, which results in the turning on of the SOI-NSCR. When applying a voltage to the third N$^+$ region, a trigger current is formed, causing the lateral SCR to enter a latch state and trigger on the SOI-NSCR.

In a second preferred embodiment of the present invention, a PMOS replaces the NMOS in a relative manner so as to form a forward bias from the N-type well to the P-type, which results in the turning on of the SOI-PSCR. A third P$^+$ region is used in the second preferred embodiment. When a voltage is applied to the third P$^+$ region, a trigger current is formed so that the lateral SCR enters a latch state and triggers on the SOI-PSCR.

It is an advantage of the present invention that the novel design of the SCR structures, together with the poly-silicon gates used to block the STI region in a SOI CMOS process, not only can the SCR device for SOI CMOS processes be realized with a compact structure, but also a quick turn-on speed for ESD protection purposes can be achieved. Furthermore, the SOI-NSCR and the SOI-PSCR according to the present invention can be integrated in a fully-depleted SOI CMOS process or a partially-depleted SOI CMOS process for use in electrostatic discharge protection circuits. These and other objectives of the present invention will no doubt become obvious to those of ordinary skill in the art after reading the following detailed description of the preferred embodiment, which is illustrated in the various figures and drawings.

DETAILED DESCRIPTION

The present invention provides an NMOS-trigger silicon controlled rectifier in silicon-on-insulator (SOI-NSCR), and a PMOS-trigger silicon controlled rectifier in silicon-on-insulator (SOI-PSCR), both of which may be integrated in fully-depleted SOI CMOS processes and partially-depleted SOI CMOS processes. The present invention also provides an electrostatic discharge protection circuit utilizing the SOI-NSCR and the SOI-PSCR.

Figure 1:
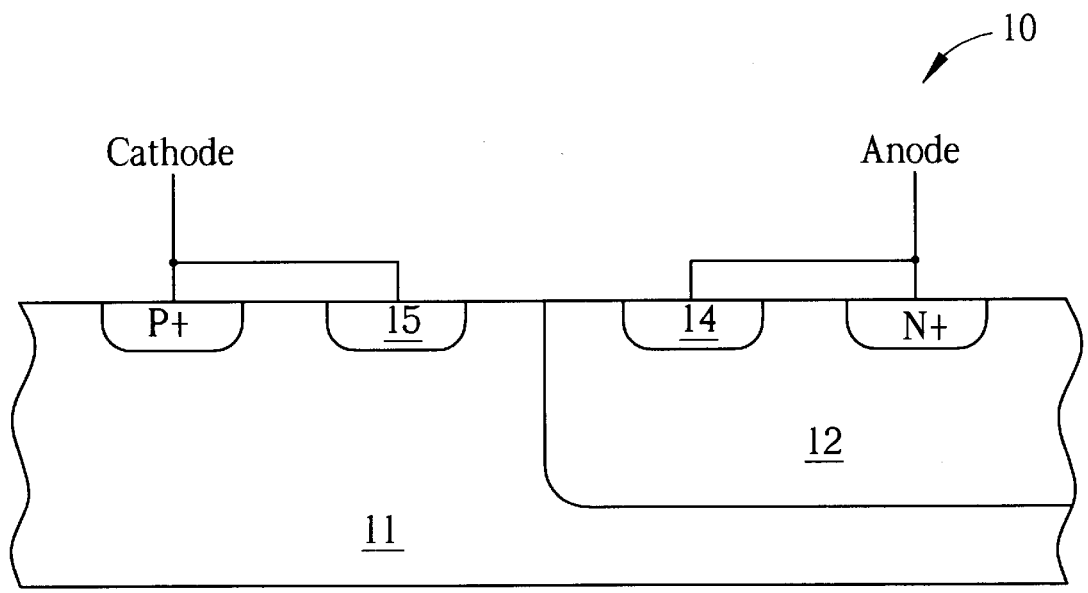
FIG. 1 is a cross-sectional schematic diagram of a SCR device realized in a P-substrate/N-well CMOS process according to the prior art.
Figure 2:
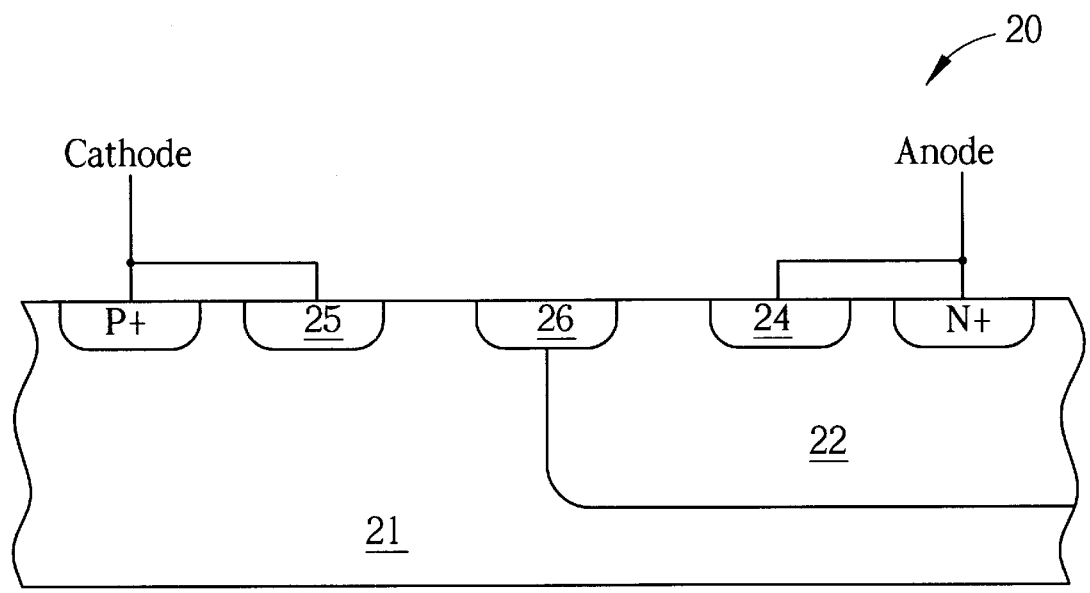
FIG. 2 is a cross-sectional schematic diagram of a modified design of a SCR device according to the prior art.
Figure 3:
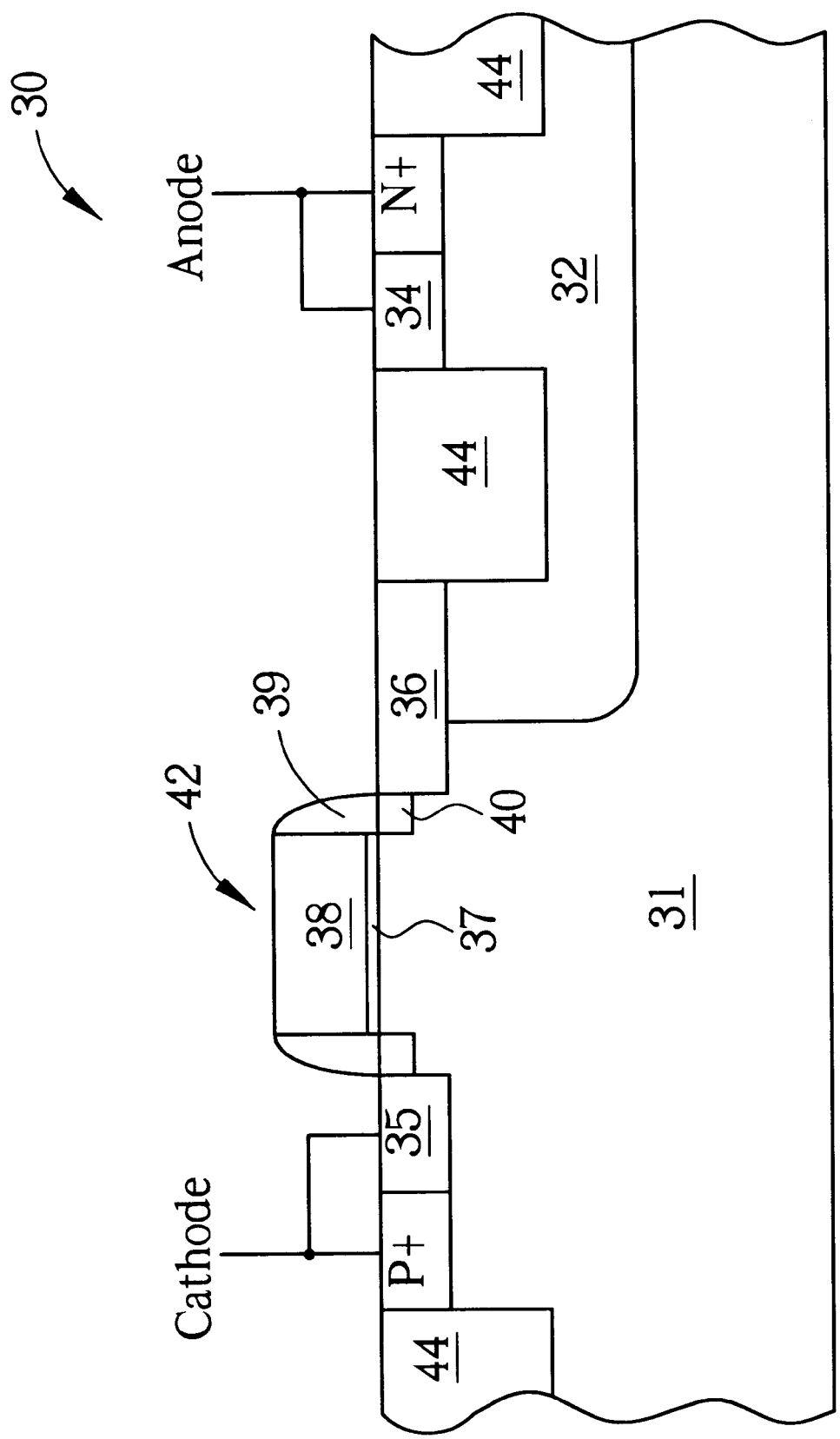
FIG. 3 is a cross-sectional schematic diagram of a second modified design of a SCR device according to the prior art.
Figure 4:
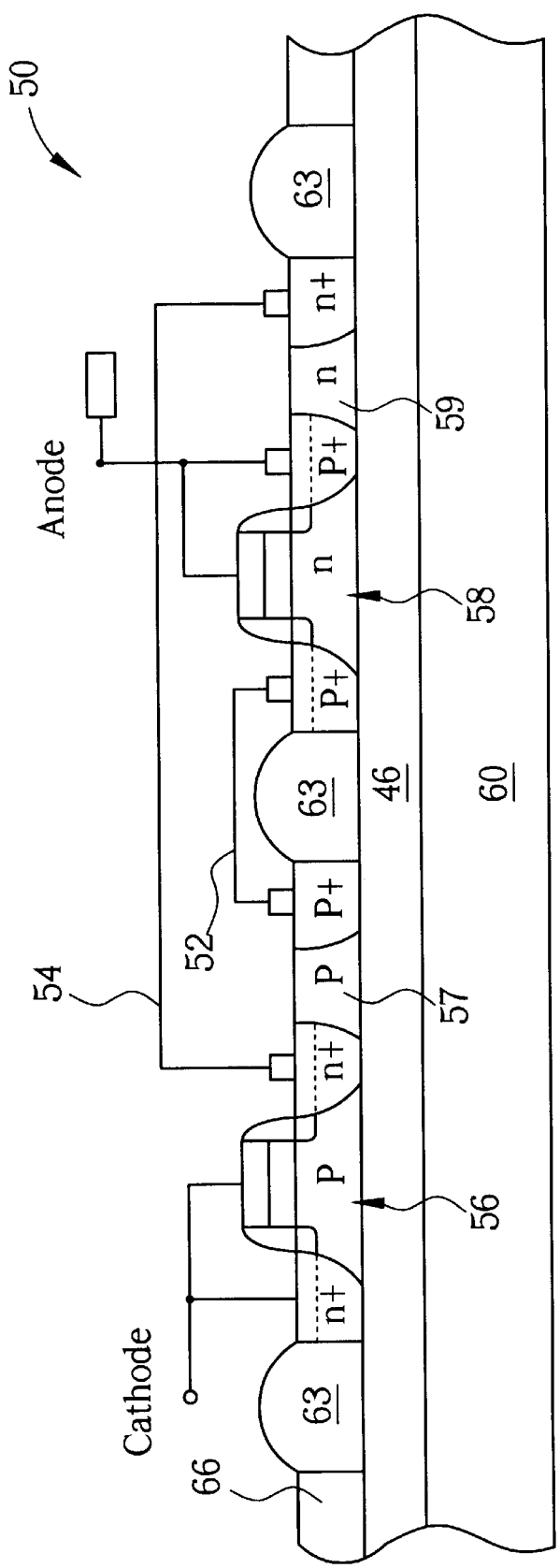
FIG. 4 is a cross-sectional schematic diagram of a bi-stable SCR-like device according to the prior art.
Figure 5A:
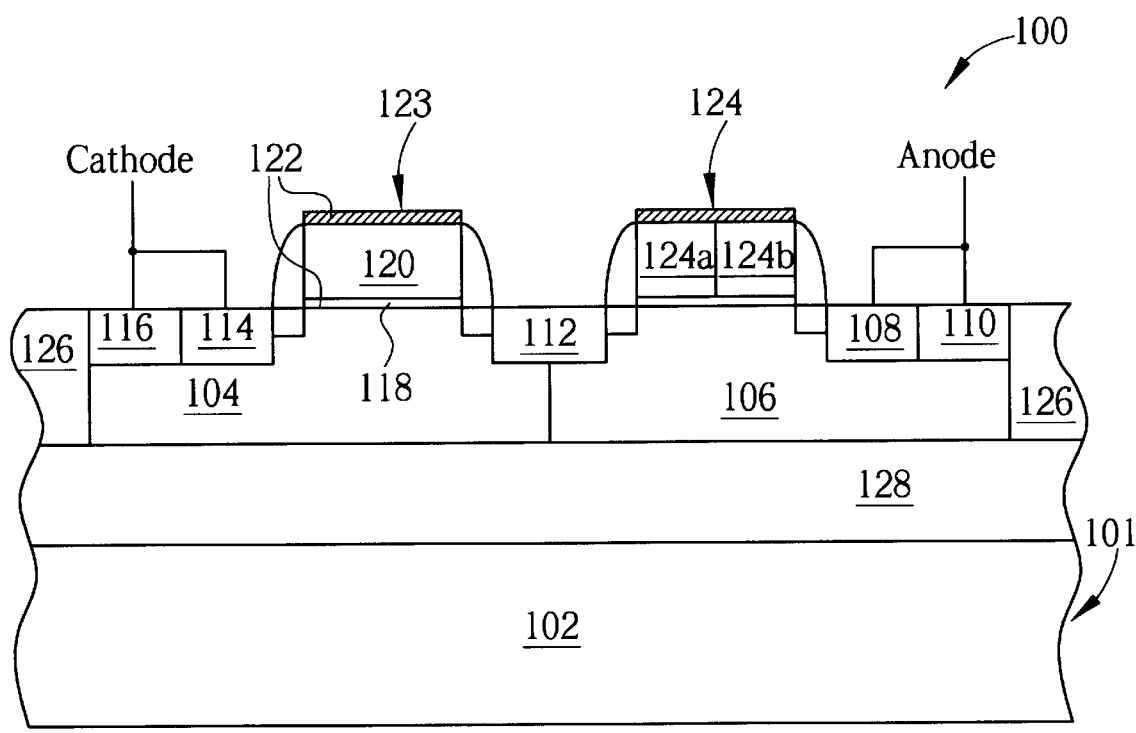
FIG. 5(a) is a schematic diagram of a SOI-NSCR device structure in a partially-depleted SOI_CMOS process according to the present invention.
Figure 5B:
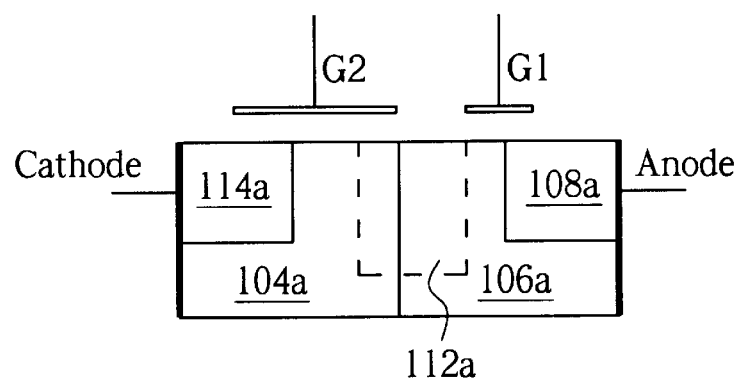
FIG. 5(b) is a schematic symbol for the SOI-NSCR device used in an on-chip ESD protection design according to the present invention.

Please refer to FIGS. 5(a) and 5(b). FIG. 5(a) is a schematic diagram of a SOI-NSCR device 100 in a partially-depleted SOI_CMOS process according to the present invention. FIG. 5(b) is a schematic symbol for the SOI-NSCR device 100, which is used for illustrative purposes in an on-chip ESD protection circuit according to the present invention. The present invention is referred to as an NMOS-trigger SCR device for SOI CMOS processes (SOI-NSCR). As shown in FIG. 5(a), the SOI-NSCR device 100 is made on an SOI substrate 101. The SOI substrate 101 comprises a P-type substrate 102, a buried oxide layer 128 and a single crystal silicon layer. A P-type well (P2) 104 is provided, which is lightly doped. An N-type well (N1) 106 is disposed adjacent to the P-type well (P2) 104 by way of a diffusion process to provide a lightly doped N-type semiconductor region. This forms a P2-N1 junction, with the N-type well (N1) 106 corresponding to the N-well layer 106a outside the dash line region in FIG. 5b, and the P-type well (P2) 104 corresponding to the P-well layer 104a outside the dash line region in FIG. 5b. A P⁺ region (P1) 108 is implanted into the N-type well 106, and corresponds to the P⁺ layer 108a adjacent to the N-type well layer 106a. The P-N junction between P⁺ region 108 and N-type well 106 provides a P1-N1 junction. An N⁺ region (N4) 110 is implanted into the N-type well (N1) 106 to provide an electrical connection for the N-type well 106. The P⁺ (P1) and N⁺ (N4) regions 108, 110 are connected together to form the anode of this SOI-NSCR device 100. A heavily doped N-type region (N3) 112 lies adjacent to the N-type well (N1) 106 and P-type well (P2) 104, and forms a new P2-N3 junction instead of the P2-N1 junction. N3 region 112 corresponds to the N⁺ region 112a within the dashed line region in FIG. 5(b).

A heavily doped N-type region (N2) 114 is provided in the P-type well (P2) 104 outside of the N-type well (N1) 106, and corresponds to the N⁺ layer 114a on the left side of FIG. 5b. The junction between the N⁺ region (N2) 114 and P-type well (P2) 104 provides a P2-N2 junction. A heavily doped P-type region (P3) 116 is provided in the P-type well (P2) 104 outside of the N-type well (N1) 106 to provide an electrical connection to the P-type well (P2) 104. The N⁺ region (N2) 114 and the P⁺ region (P3) 116 are connected together to form the cathode of the SOI-NSCR device 100. A gate (G2) 122, comprising a gate insulator 118 and gate material 120, is located above the heavily doped N-type region (N3) 112, the P-well (P2) region 104, and the N-type region (N2) 114. These regions form the structure for an NMOS 123. Another dummy gate (G1) 124 is added above the P-type region (P1) 108, the N-type well (N1) 106, and the N-type heavily doped region (N3) 112 to isolate the P-type region (P1) 108 from the heavily doped N-type region (N3) 112. There are two doped regions 124a, 124b on the isolating dummy gate (G1) 124. The first region 124a, adjacent to the N-type heavily doped region (N3) 112, is doped with N-type materials, and the second region 124b of the gate (G1) 124, adjacent to the P-type region (P1) 108, is doped with P-type materials. Polycide, which is a conducting material, is added on the top surface of the gate 124 to reduce the poly-silicon gate resistance. The P-type region (P1) 108, the N-well region,(N1) 106, the P-well region (P2) 104, and the N-type region (N2) 114 together form a lateral SCR. These structures are isolated from other devices by two shallow trench isolation (STI) areas 126. The buried oxide layer 128, in between the P-type substrate 102 and the device structures, further isolates components from each other.

Since the junction breakdown voltage of the P2-N3 junction is lower than the junction breakdown voltage of the P2-N1 junction, the turn-on speed for the SOI-NSCR device 100 is accelerated. When a positive transient voltage is applied across the anode and the cathode of the SOI-NSCR device 100, the positive transient voltage causes current to flow through the P⁺ diffusion region (P1) 108 of the anode into the N-type well (N1) 106. The P2-N3 junction breaks down if the transient voltage is higher than the junction breakdown voltage of the P2-N3 junction. The current then flows from the P-type well (P2) 104 to the N⁺ region (N2) 114 across the P2-N2 junction to the cathode.

To turn on the NMOS 123, the NMOS gate (G2) 122 is triggered to cause current to flow from the N-type well (N1) 106 into the P-type well (P2) 104. This causes a forward bias, which turns on the SOI-NSCR device 100. The SOI-NSCR device 100 is also triggered on if a current directly flows into the N-type heavily doped region (N3) 112, which is used as an N-type trigger node for reducing the trigger voltage for the SOI-NSCR device 100. When a voltage is applied to the N-type heavily doped region 112 (N3), a trigger current through the N trigger node is generated, and the lateral SCR enters a latch state and is triggered on so that the SOI-NSCR 100 is quickly turned on. Current incurred from a positive transient voltage across the anode and the cathode is thus discharged to the cathode.

When a negative transient voltage is applied across the anode and the cathode of the SOI-NSCR device 100, current flows from the cathode through the P-type region (P3) 116 into the P-type well (P2) 104. Under this biasing, the P-well (P2)/N-well (N1) junction is forward biased, and the current thus flows into the N-type well (N1) 106. Finally, the current flows from the N-type well 106 to the anode of the SOI-NSCR 100 through the N⁺ region (N4) 110.

Please refer to FIG. 5(b) for a schematic symbol of the SOI-NSCR device 100, which is used to illustrate an on-chip ESD protection design according to the present invention. The schematic symbol in FIG. 5(b) shows the SOI-NSCR device 100 as a five-layered semiconductor device, having a first layer of heavily doped P-type material (P1) 108a disposed adjacent to an N-well layer (N1) 106a. The N-well layer 106a is disposed adjacent to a P-well layer (P2) 104a and a layer of heavily doped N-type material (N3) 112a. The N3 layer 112a lies within the dashed line region of FIG. 5(b). Another heavily doped N-type layer (N2) 114a is on the left side, adjacent the P2 layer 104a. The P-type layer (P1) 108a is connected on one side as the anode of the SOI-NSCR device 100, and the N-type layer (N2) 114a is connected to the other side as the cathode-SOI-NSCR. NMOS gate (G2) is above N3 region 112a, P2 (P-well) layer 104a, and N2 region 114a. The dummy gate (G1) is above P1 region 108a, N1 (N-well) layer 106a, and N3 region 112a.

Figure 5C:
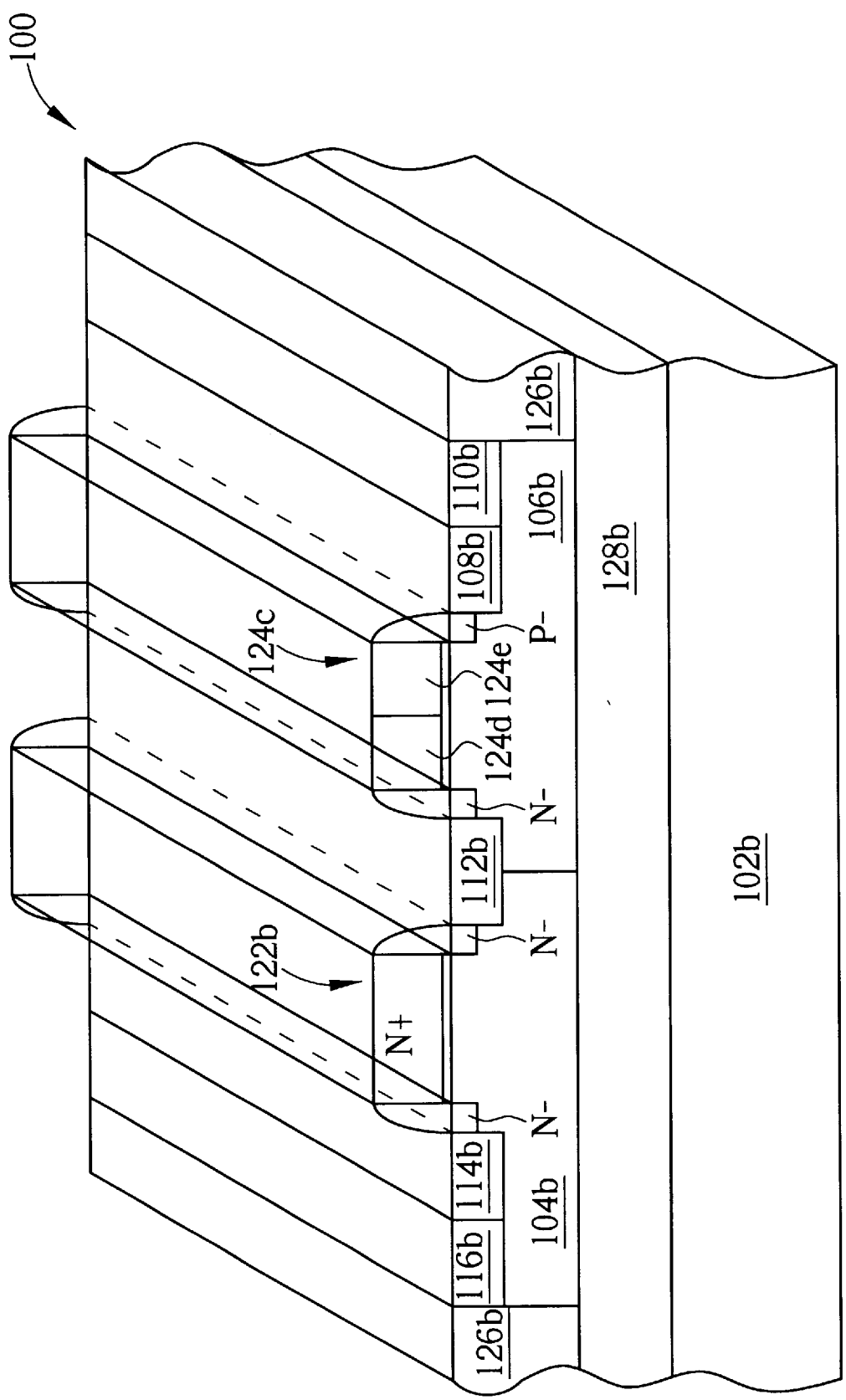
FIG. 5(c) illustrates a perspective cross-sectional view of a SOI-NSCR device in a partially-depleted SOI CMOS process according to the present invention.

Please refer to FIG. 5(c). FIG. 5(c) is a perspective cross-sectional view of the SOI-NSCR device 100 in a partially-depleted SOI CMOS process according to the present invention. For illustrative purposes, the upper interconnect layer is not shown. A P-type substrate is provided, which has an internal insulating layer. The insulating layer is an implanted layer formed according to silicon-on-insulator (SOI) CMOS technology. This results in an upper layer of non-oxidized substrate overlying the insulating layer. The upper layer substrate is the layer on which active circuits are formed.

As shown in FIG. 5(c), the total structure is made in an isolated island, and the lateral insulating layer 126b is made by way of a shallow trench isolation process. There are two lightly doped regions on the silicon layer above the insulating layer. A first P-type region (P2) 104b is made on one side, and a P$^+$ contact-region (P3) 116b is formed between the N2 region 114b and the lateral insulating layer 126b. A lightly doped N-type region (N1) 106b lies adjacent P2 region 104b, and an N$^+$ contact region (N4) 110b is formed between the P1 region 108b and the lateral insulating layer 126b. A heavily doped N-type region (N2) 114b is in P2 region 104b, and another heavily doped N-type region (N3) 112b is within N1 region 106b and P2 region 104b. A gate structure 122b is above N2 layer 114b, N3 layer 112b, and P2 layer 104b, and all of these regions form an NMOS structure. Polycide, which is a conducting material, is added on the top surface of the gate 122b to reduce the poly-silicon gate resistance. The N$^+$ region (N2 and N3) 114b, 112b are formed by way of the source/drain process associated with conventional transistor technology after completing the lightly doped drain (LDD) and spacer at either side of the gate 122b. A heavily doped P-type layer (P1) 108b is adjacent to the N4 region 110b within the N1 106b layer. A dummy gate 124c has two doped regions 124d, 124e, and is above P1 layer 108b, N1 layer 106b and N3 layer 112b. The gate 124c is used to separate the P1 region 108b and the N3 region 112b therefore its dopant concentration and dopant type have no effect on the SOI-NSCR device 100. In order to be fully compatible with the deep-sub-micron CMOS process and increase the alignment tolerance. There are two doped regions on the isolating dummy gate, the first region 124d is a doped N-type region adjacent to the N3 region 112b, and the other region 124e is a doped P-type region adjacent to P1 region 108b. The SOI-NSCR 100 according to the present invention can be integrated in partially-depleted SOI CMOS processes.

Figure 6A:
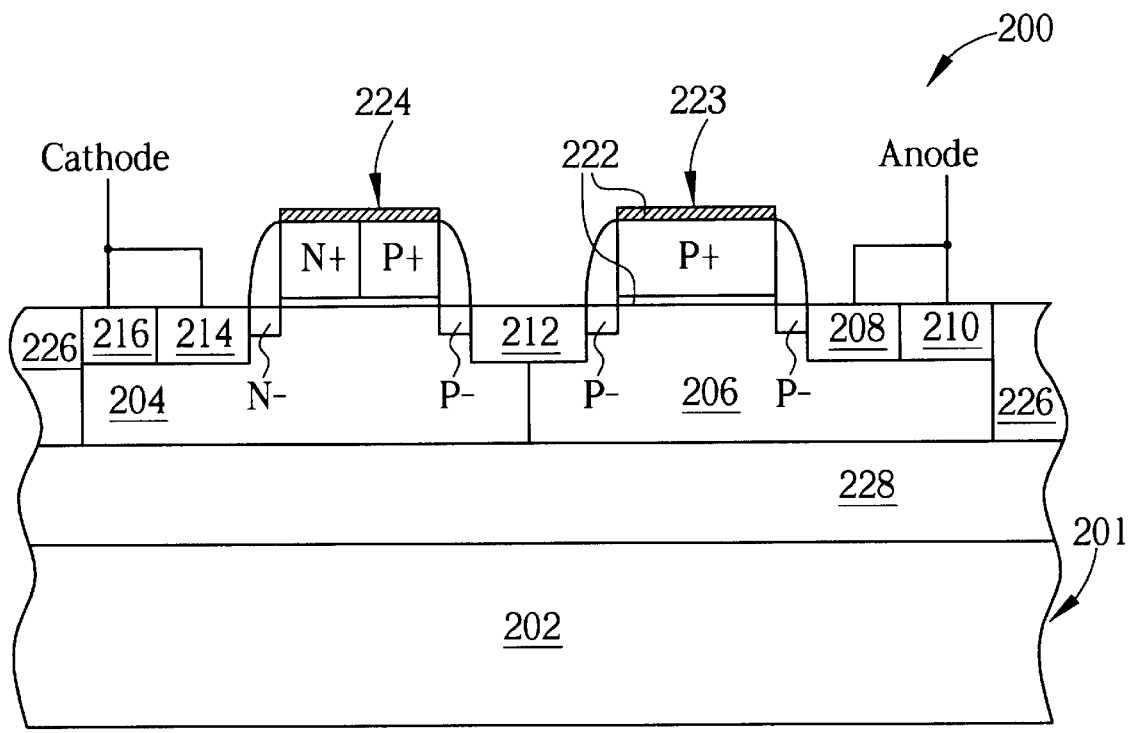
FIG. 6(a) is a schematic diagram of the SOI-PSCR device structure in a partially-depleted SOI_CMOS process according to the present invention.
Figure 6B:
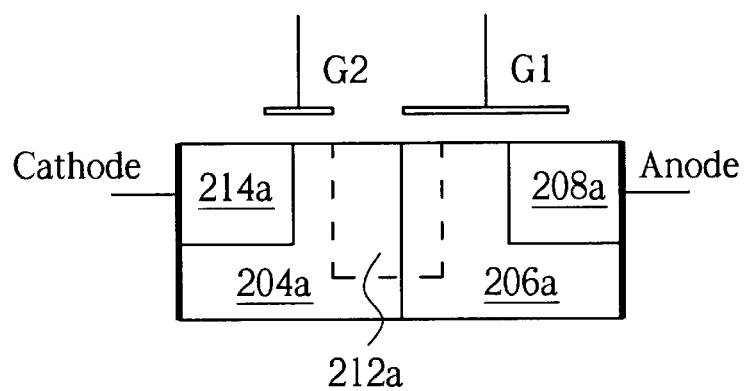
FIG. 6(b) is a schematic symbol for the SOI-PSCR device used in an on-chip ESD protection design according to the present invention.
Figure 6C:
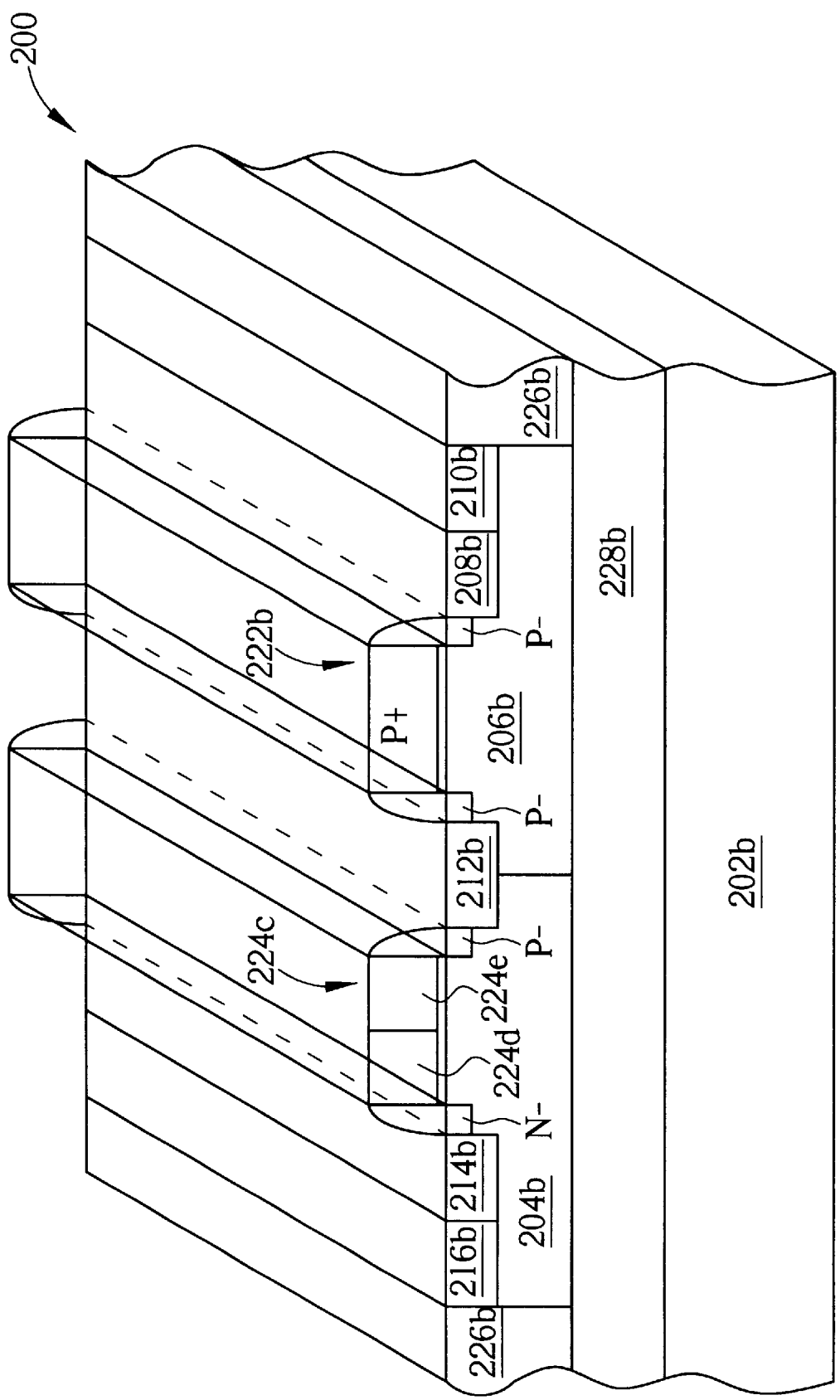
FIG. 6(c) is a perspective cross-sectional view of a SOI-PSCR device in a partially-depleted SOI CMOS process according to the present invention.

In the second embodiment of the present invention, a similar methodology is applied to a PMOS-trigger SCR device (SOI-PSCR) for SOI CMOS processes by adding a P-type heavily doped region (P3) between the P-well region (P2) and the N-well region (N1), instead of the N-type heavily doped region (N3) in FIG. 5(a). Please refer to FIG. 6(a) to FIG. 6(c). FIG. 6(a) is a schematic diagram of a SOI-PSCR device 200 for a partially-depleted SOI_CMOS process according to the present invention. FIG. 6(b) is a schematic symbol for the SOI-PSCR device 200 for illustrative purposes in an on-chip ESD protection design according to the present invention. FIG. 6(c) is a perspective cross-sectional view of the SOI-PSCR device 200 in a partially-depleted SOI CMOS process according to the present invention. The P-type heavily doped region 212 and N-well region 206 form a new second P-N junction of the SOI-PSCR device 200. The P$^+$ (P1) region 208 and the N$^+$ (N3) region 210 are connected together to form the anode of the SOI-PSCR device 200. The N$^+$ (N2) region 214 and the P$^+$ (P4) region 216 are connected together to form the cathode of the SOI-PSCR device 200. A PMOS structure 223 with a gate (G1) 222 is formed above the first P-type heavily doped region (P1) 208, the N1 region 206, and the added P-type heavily doped region (P3) 212. The dummy gate (G2) 224 is used to separate the N2 region 214 and the P3 region 212, and is disposed above the N2 region 214, the P3 region 212 and the P2 region 204. A buried oxide layer 228 lies between the P-type substrate 202 and the device structures to isolate them from each other.

The symbol for the SOI-PSCR device 200 is shown in FIG. 6b. The schematic symbol in FIG. 6(b) shows, conceptually, the SOI-PSCR device 200 as a five-layered semiconductor device, having a first layer of heavily doped P-type material (P1) 208a disposed adjacent to an N-well layer (N1) 206a. The N-well layer 206a is disposed adjacent to a P-well (P2) 204a and a heavily doped P-type material (P3) 212a. The P3 layer 212a is within the dashed line region of FIG. 6(b). A heavily doped N-type layer (N2) 214a is on the left side adjacent the P2 layer 204a. The P-type layer (P1) 208a is connected on one side thereof as the anode of the SOI-PSCR device 200, and the N-type layer (N2) 214a is connected to the other side thereof as the cathode of the SOI-PSCR device 200. PMOS gate (G1) is above P3 region 212a, N1 (N-well) layer 206a, and P1 region 208a, and the dummy gate (G2) is above N2 region 214a, P2 (P-well) layer 204a, and P3 region 212a.

When a control voltage is applied to the gate G1 222, or a trigger current is applied to the P$^+$ (P3) region 212, the SOI-PSCR device 200 is triggered on to provide a low-impedance path from its anode to its cathode. The SOI-PSCR device 200 can be used in on-chip ESD protection circuits to protect SOI CMOS IC's.

Please refer to FIG. 6(c). FIG. 6(c) is a perspective cross-sectional view of the SOI-PSCR device 200 in a partially-depleted SOI CMOS process according to the present invention. For illustrative purposes, the upper interconnect layer is not shown. A P-type substrate is provided, which has an internal insulating layer. The insulating layer is an implanted layer formed according to silicon-on-insulator (SOI) CMOS technology. This results in an upper layer of non-oxidized substrate overlying the insulating layer. The upper layer substrate is the layer in which active circuits are formed.

As shown in FIG. 6(c), the total structure is made in an isolated island, and a lateral insulating layer 226b is made by way of a shallow trench isolation process. There are two lightly doped regions on the silicon layer above the insulating layer. A first P-type region (P2) 204b is made on one side, and a P$^+$ contact-region (P4) 216b is formed between the N2 region 214b and the lateral insulating layer 226b. A lightly doped N-type region (N1) 206b is disposed adjacent to P2 region 204b, and an N$^+$ contact region (N3) 210b is formed between the P1 region 208b and the lateral insulating layer 226b. A heavily doped P-type region (P1) 208b is in N1 layer 206b, and another heavily doped P-type region (P3) 212b is within N1 layer 206b and P2 layer 204b. A gate structure 222b is above P1 layer 208b, P3 layer 212b, and N1 layer 206b, and all of these regions form a PMOS structure. The P$^+$ regions (P1 and P3) 208b, 212b are formed by way of a source/drain process associated with conventional transistor technology. A heavily doped N-type layer (N2) 214b is adjacent to the P4 region 216b within the P2

204b layer. A dummy gate 224c has two doped regions 224d, 224e, and lies above N2 layer 214b, P2. layer 204b, and P3 layer 212b. The first region 224d is a doped N-type region adjacent to the N2 region 214b, and the other region 224e is a doped P-type region adjacent to P3 region 212b. The gate 224c is used to separate the N2 region 214b and the P3 region 212b. A buried oxide layer 228b lies in between the P-substrate 202 and the device structures to isolate them from each other. The SOl-PSCR 200 according to the present invention can be integrated in partially depleted SOI CMOS processes.

Figure 7A:
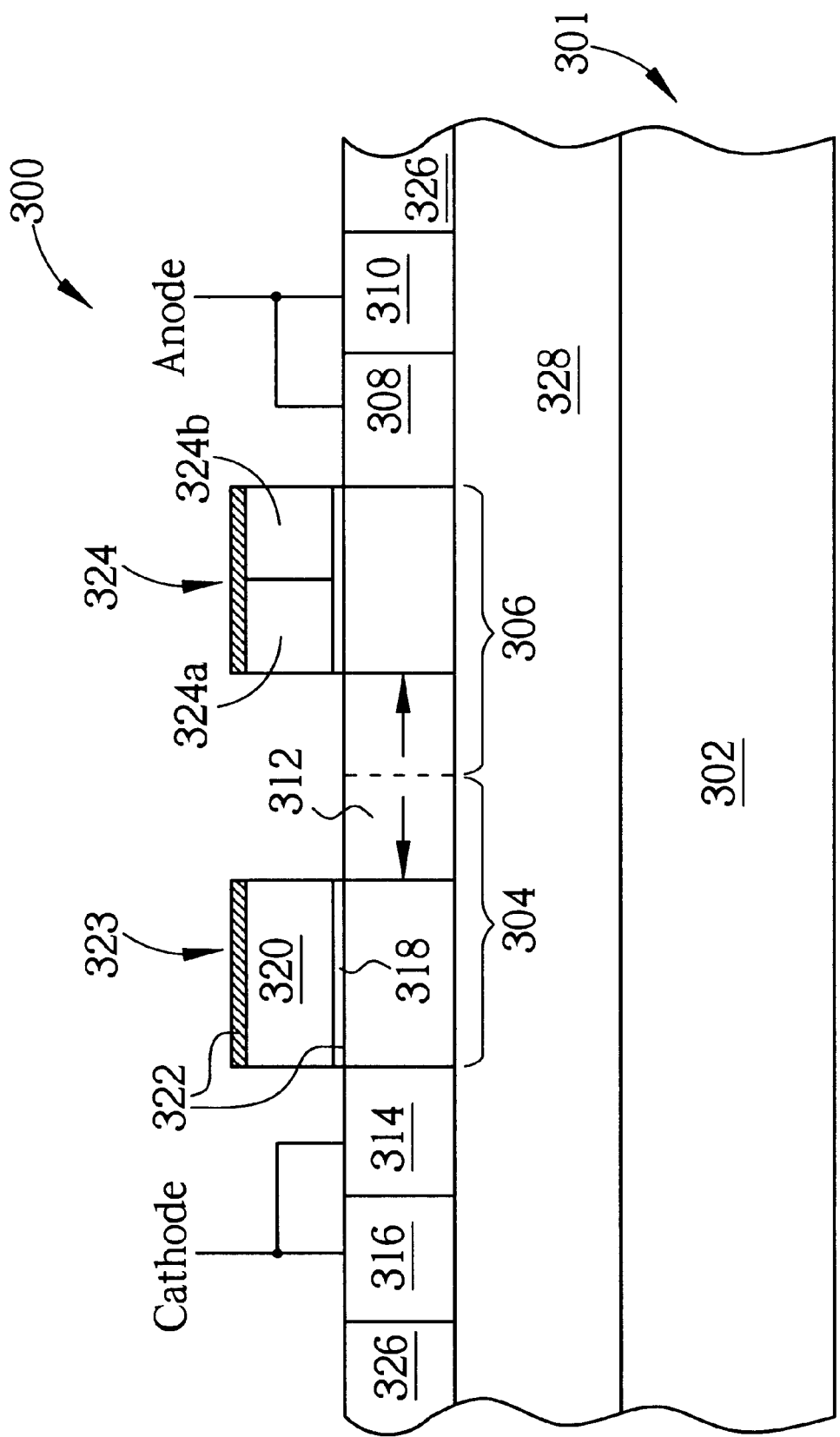
FIG. 7(a) is a schematic diagram of a SOI-NSCR device structure in a fully-depleted SOI_CMOS process according to the present invention.
Figure 7B:
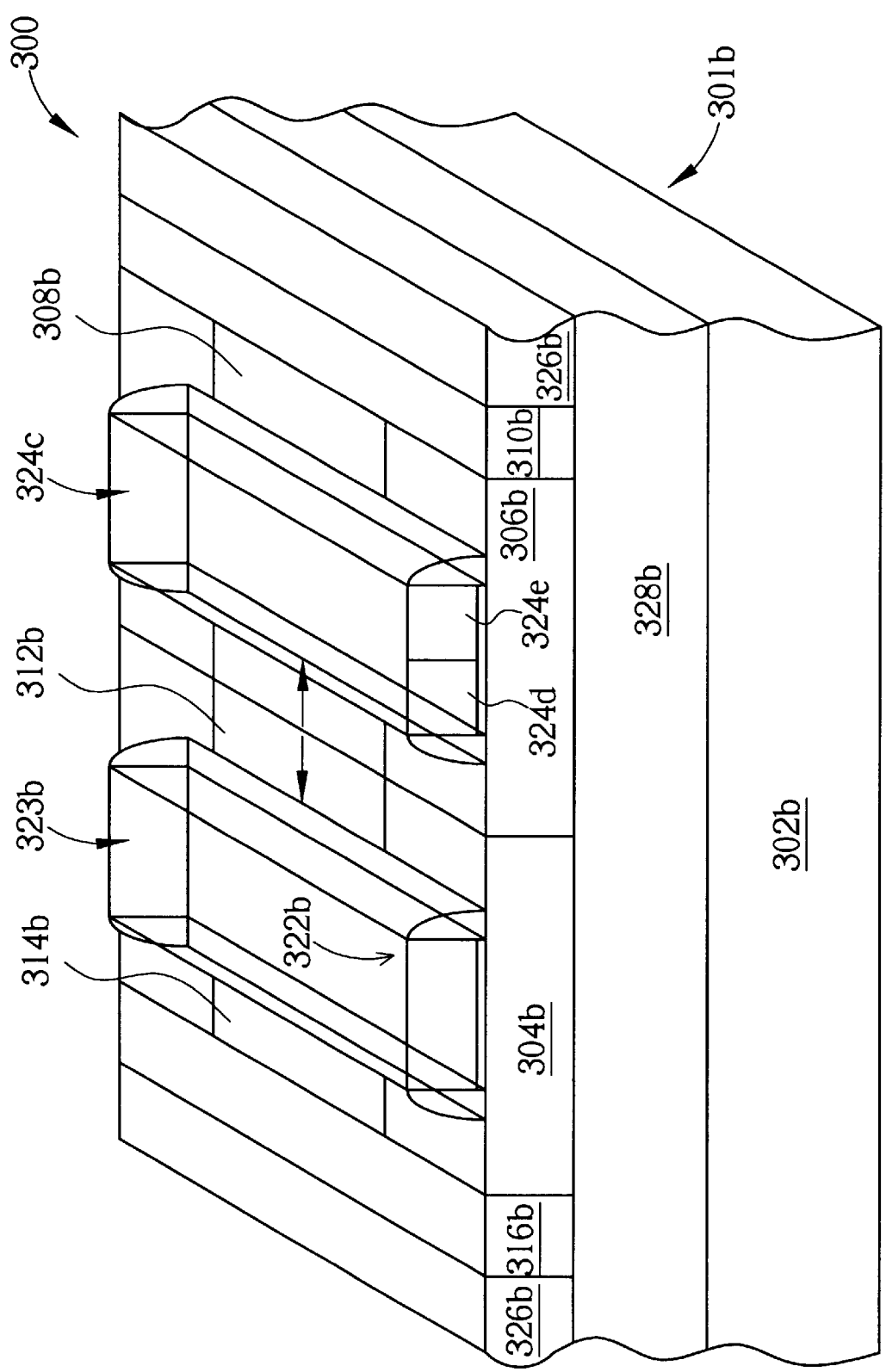
FIG. 7(b) is a perspective cross-sectional view of the SOI-NSCR device in a fully-depleted SOI CMOS process according to the present invention.

In the third preferred embodiment of the present invention, a fully depleted SOI-NSCR structure is proposed. Please refer to FIG. 7(a) and FIG. 7(b). FIG. 7(a) is a schematic diagram of a SOI-NSCR device 300 for a fully-depleted SOI_CMOS process according to the present invention. FIG. 7(b) is a perspective cross-sectional view of the SOI-NSCR device 300. As shown in FIG. 7(a), the SOI-NSCR device 300 structure is made on a SOI substrate 301. The SOI substrate 301 includes a P-type substrate 302. A buried oxide layer 328 is formed atop the P-type substrate 302 according to silicon-on-insulator (SOI) CMOS technology. This results in an upper layer of non-oxidized substrate, which is usually a single crystal silicon layer, overlying the buried oxide layer 328. The upper layer substrate is the layer in which active circuits are formed, and the entire doping area extends longitudinally through the upper layer substrate.

A P-type well (P2) 304 is provided that is lightly doped. An N-type well (N1) 306 is disposed adjacent to the P-type well (P2) 304 by way of a diffusion process to provide a lightly doped N-type semiconductor region. A P+ region (P1) 308 is implanted into the N-type well 306. The P-N junction between P+ region 308 and N-well 306 provides a P1-N1 junction. An N+ region (N4) 310 is implanted in the N-well (N1) 306 to provide an electrical connection for the N-type well 306. The P+ (P1) and N+ (N4) regions 308, 310 are connected together to form the anode of the SOI-NSCR device 300. A heavily doped N-type region (N3) 312 overlaps with portions of both the N-type well (N1) 306 and the P-type well (P2) 304, and forms a new P2-N3 junction, rather than the P2-N1 junction.

A heavily doped N-type region (N2) 314 is provided in the P-type well (P2) 304 outside of the N-type well (N1) 306. The junction between the N+ region (N2) 314 and P-type well (P2) 304 provides a P2-N2 junction. A heavily doped P-type region (P3) 316 is provided in the P-type well (P2) 304 outside of the N-type well (N1) 306 to provide an electrical connection to the P-type well (P2) 304. The N+ region(N2) 314 and the P+ region(P3) 316 are connected together to form the cathode of the SOI-NSCR device 300. A gate (G2) 322, comprising a gate insulator 318 and gate material 320, is located above the heavily doped N-type region (N3) 312, the P-well(P2) region 304, and the N-type region(N2) 314. These regions form an NMOS 323. Another dummy gate (G1) 324 is added above the P-type region (P1) 308, the N-well region (N1) 306, and the N-type heavily doped region (N3) 312 to isolate the P-type region (P1) 308 from the heavily doped N-type region (N3) 312. There are two doping regions 324a, 324b in the isolating dummy gate (G1) 324. The first region 324a, adjacent to the N-type heavily doped region (N3) 312, is N-type, and the second region 324b, adjacent to the P-type region (P1) 308, is P-type. Polycide, which is a conducting material, is added to the top surface of the gate 324 to reduce poly-silicon gate resistance. These structures are isolated from other devices by two shallow trench isolation (STI) areas 326. The most significant differences between the SOI-NSCR device 300 and the SOI-NSCR device 100 are found in: the P-type region (P1) 308, the N4 region 310, the N+ region (N2) 314, the P-type region (P3) 316, and that the N-type heavily doped region (N3) 312 directly contacts the buried oxide layer 328 in the SOI substrate 301.

When a positive transient voltage is applied across the anode and the cathode of the SOI-NSCR device 300, the positive transient voltage causes current to flow through the anode of P+ diffusion region(P1) 308 into the N-type well (N1) 306. The P2-N3 junction breaks down if the transient voltage is higher than the junction breakdown voltage of the P2-N3 junction. The current then flows from the P-type well (P2) 304 to the N+ region (N2) 314 across the P2-N2 junction to the cathode. In order to turn on the NMOS 323, the NMOS gate (G2) 322 is triggered to cause a current to flow from the N-type well (N1) 306 into the P-type well (P2) 304. This creates a forward bias, resulting in a turning on of the SOI-NSCR device 300. The SOI-NSCR device 300 can also be triggered on if a current directly flows into the N-type heavily doped region (N3) 312. When a negative transient voltage is applied across the anode and the cathode of the SOI-NSCR device 300, the negative transient voltage is discharged to the anode through the forward biased P2-N1 junction.

As shown in FIG. 7(b), the SOI-NSCR device 300 structure is made on a silicon substrate 301b. The silicon substrate 301b comprises a P-t substrate 302b. A buried oxide layer 328b is formed within the P-type substrate 302b according to silicon-on-insulator (SOI) CMOS technology. This results in an upper layer of non-oxidized substrate overlying the buried oxide layer 328b. The upper layer substrate is the layer in which the active circuits are formed and the entire doping area longitudinally extends through the upper layer substrate. There are two lightly doped regions on the silicon layer above the buried oxide layer 328b. A lateral insulating layer 326b is made by way of a shallow trench isolation process. A first P-type region (P2) 304b is made on one side, and a P+ contact-region (P3) 316b is formed between the P2 region 304b and the lateral insulating layer 326b. A lightly doped N-type region (N1) 306b is adjacent to P2 region 304b, and an N+ contact region (N4) 310b is formed between the N1 region 306b and the lateral insulating layer 326b. A heavily doped N-type region (N2) 314b is in P2 layer 304b, and another heavily doped N-type region (N3) 312b overlaps with portions of both the N1 region 306b and P2 region 304b. A gate structure 322b is above N2 layer 314b, N3 layer 312b and P2 layer 304b, and all of these regions form an NMOS 323b. Polycide, which is a conducting material, is added on top surface of the gate 322b to reduce poly-silicon gate resistance. The N+ regions (N2 and N3) 314b, 312b are formed by way of a source/drain process associated with conventional transistor technology after completing the lightly doped drain (LDD) and spacer (not shown) at either side of the gate 322b. A heavily doped P-type layer (P1) 308b is adjacent to the N4 region 310b within the N1 layer 306b. A dummy gate 324c has two doped regions 324d, 324e, and is above P1 layer 308b, N1 layer 306b and N3 layer 312b. The first region 324d is N-type, adjacent to the N3 region 312b, and the other region 324e is P-type, adjacent to P1 region 308b. The gate 324c is used to separate the P1 region 308b and the N3 region 312b.

Figure 8A:
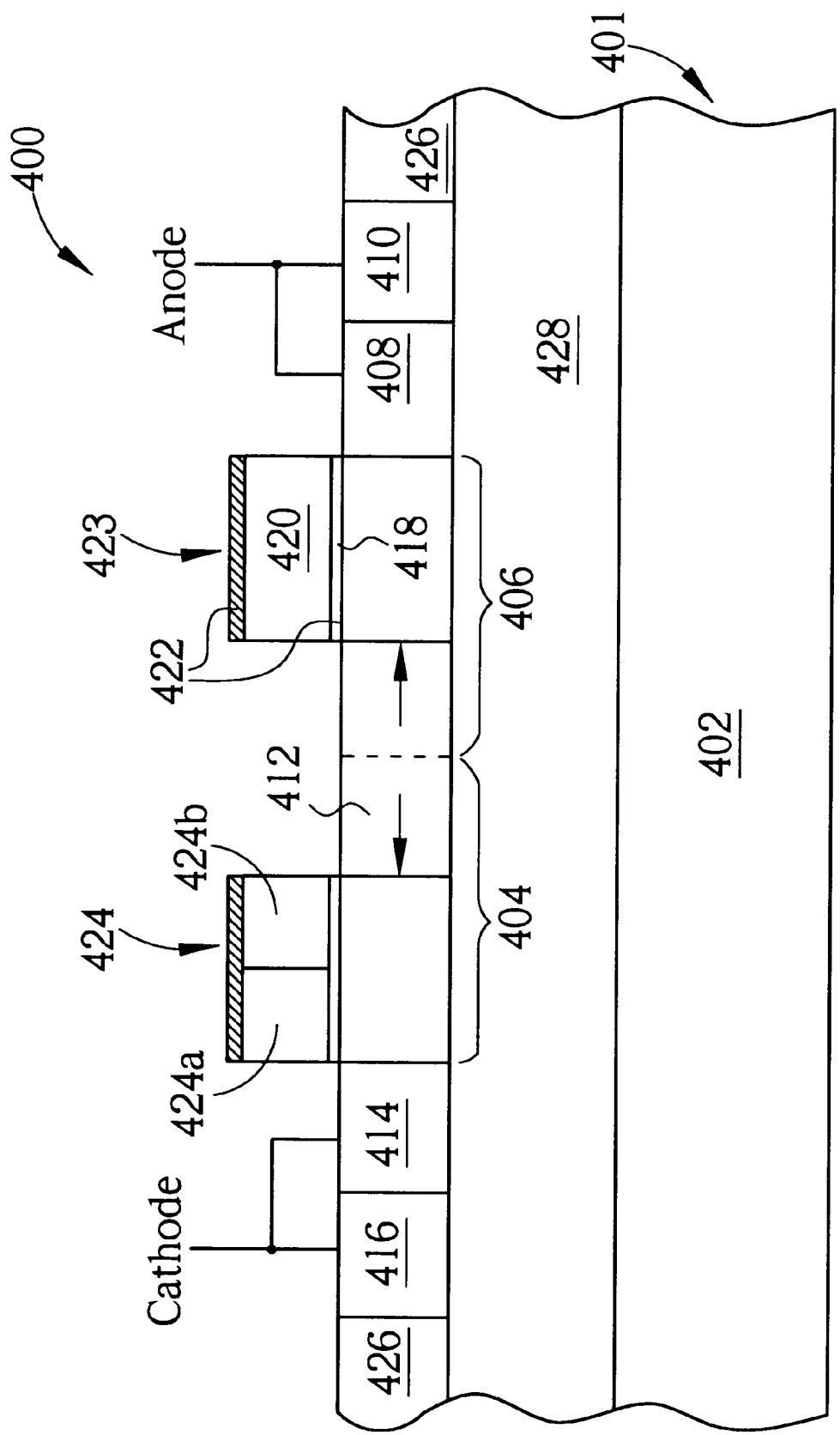
FIG. 8(a) is a schematic diagram of a SOI-PSCR device structure in a fully-depleted SOI_PMOS process according to the present invention.
Figure 8B:
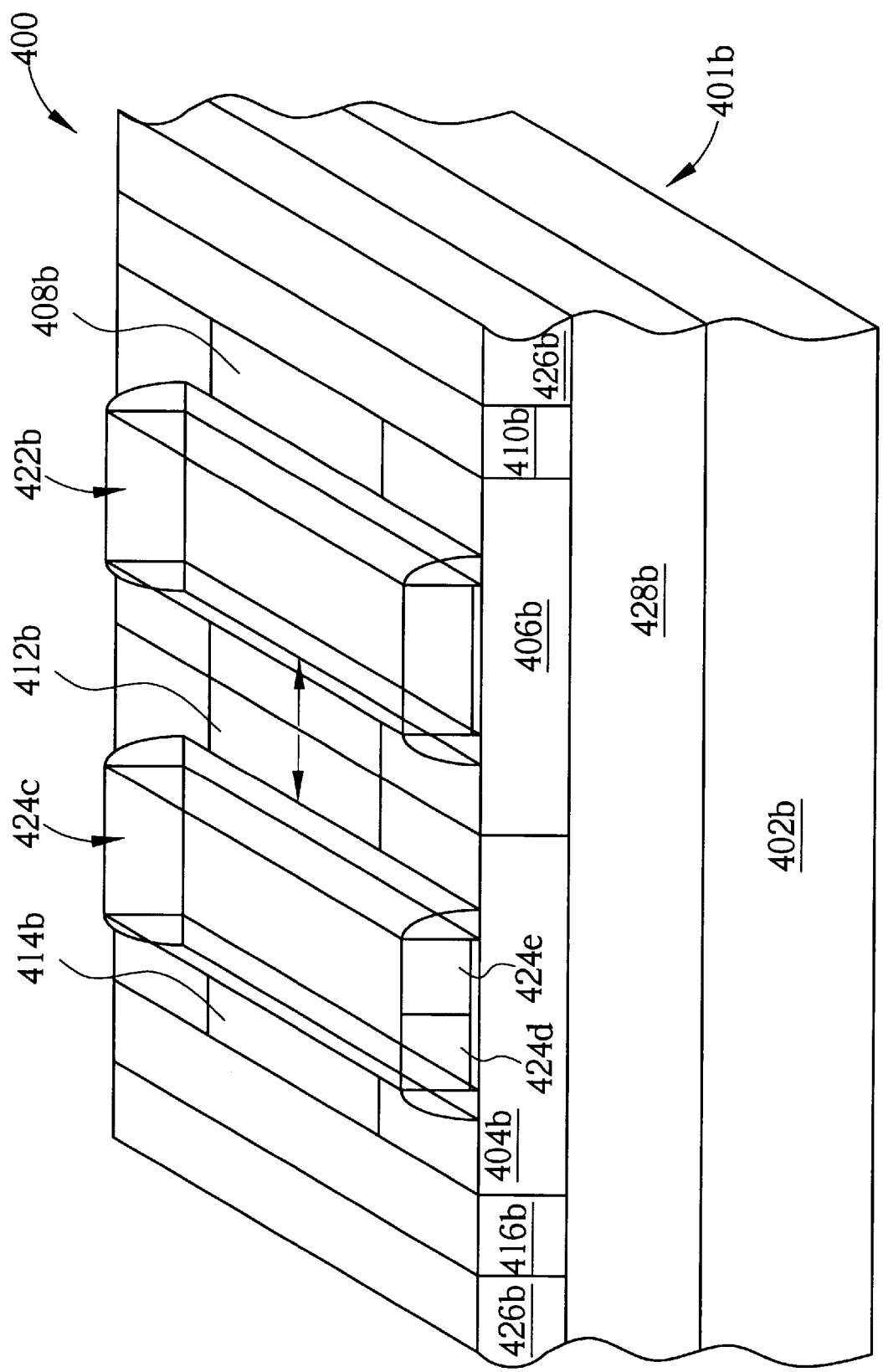
FIG. 8(b) is a perspective cross-sectional view of a SOI-PSCR device in a fully-depleted SOI CMOS process according to the present invention.

In the fourth embodiment of the present invention, a fully depleted SOI-PSCR structure is proposed. Please refer to FIG. 8(a) and FIG. 8(b). FIG. 8(a) is a schematic diagram of a SOI-PSCR device 400 for a fully-depleted SOI PMOS process according to the present invention. FIG. 8(b) is a perspective cross-sectional view of the SOI-PSCR device 400 in a fully-depleted SOI CMOS process according to the present invention. As shown in FIG. 8(*a*), the SOI-PSCR device 400 is made on a SOI substrate 401. The SOI substrate 401 comprises a P-type substrate 402. A buried oxide layer 428 is formed within the P-type substrate 402 according to silicon-on-insulator (SOI) CMOS technology. This results in an upper layer of non-oxidized substrate, which is usually a single crystal silicon layer, overlying the buried oxide layer 428. The upper layer substrate is the layer in which active circuits are formed, and the entire doping area extends longitudinally through the upper layer substrate.

A P-type heavily doped region 412 and an N-well region 406 form a new second P-N junction of the SOI-PSCR device 400. A P$^+$ (P1) region 408 and an N$^+$ (N3) region 410 are connected together to form the anode of the SOI-PSCR device 400. The N$^+$ (N2) region 414 and the P$^+$ (P4) region 416 are connected together to form the cathode of the SOI-PSCR device 400. A PMOS structure 423 with a gate (G1) 422 is formed above the first P-type heavily doped region (P1) 408, the N1 region 406, and the added P-type heavily doped region (P3) 412. A dummy gate (G2) 424 separates the N2 region 414 and the P3 region 412, and is above the N2 region 414, the P3 region 412, and the P2 region 404. A buried oxide layer 428 lies between the P-substrate 402 and the device structures to isolate them from each other.

When a control voltage is applied to the gate G1 422, or a trigger current is applied to the P$^+$ (P3) region 412, the SOI-PSCR device 400 is triggered on to provide a low-impedance path from its anode to its cathode. The SOI-PSCR device 400 can be used in on-chip ESD protection circuits to protect SOI CMOS IC's.

As shown in FIG. 8(*b*), the SOI-NSCR device 400 structure is made on a SOI substrate 401*b*. The SOI substrate 401*b* comprises a P-type substrate 402*b*. A buried oxide layer 428*b* is formed within the P-type substrate 402*b* according to silicon-on-insulator (SOI) CMOS technology. This results in an upper layer of non-oxidized substrate overlying the buried oxide layer 428*b*. The upper layer substrate is the layer in which the active circuits are formed, and the entire doping area extends longitudinally through the upper layer substrate. There are two lightly doped regions on the silicon layer above the buried oxide layer 428*b*, and the lateral insulating layer 426*b* is made by way of a shallow trench isolation process.

A first P-type region (P2) 404*b* is made on one side, and a P$^+$ contact-region (P4) 416*b* is formed between the P2 region 404*b* and the lateral insulating layer 426*b*. A lightly doped N-type region (N1) 406*b* is adjacent to P2 region 404*b*, and an N$^+$ contact region (N3) 410*b* is formed between the N1 region 406*b* and the lateral insulating layer 426*b*. A heavily doped P-type region (P3) 412*b* overlaps portions of both the N1 region 406*b* and P2 region 404*b*. A gate structure 422*b* is above P1 layer 408*b*, P3 layer 412*b*, and N1 layer 406*b*, and all of these regions form a PMOS. The P$^+$ regions (P1 and P3) 408*b*, 412*b* are formed with by way of a source/drain process associated with conventional transistor technology. A heavily doped N-type layer (N2) 414*b* is adjacent to the P4 region 416*b* within the P2 404*b* layer. A dummy gate 424*c* has two doped regions 424*d*, 424*e*, and is above N2 layer 414*b*, P2 layer 404*b* and P3 layer 412*b*. The first region 424*d* is N-type and adjacent to the N2 region 414*b*, and the other region 424*e* is P-type adjacent to P3 region 412*b*. The gate 424*c* is used to separate the N2 region 414*b* and the P3 region 412*b*.

Figure 9:
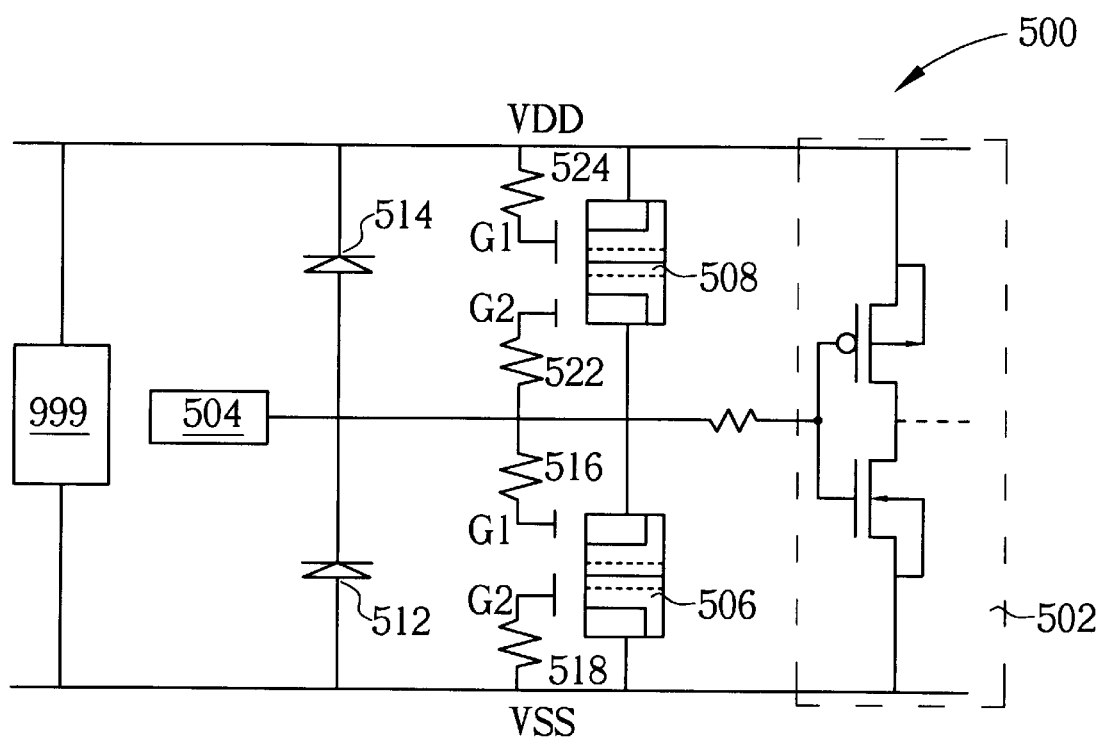
FIG. 9 is a circuit diagram of an ESD protection circuit for an input pad that utilizes silicon controlled rectifier devices in a SOI CMOS process according to the present invention.

The silicon controlled rectifier devices for silicon-on-insulator (SOI) CMOS processes may be utilized in an ESD protection circuit for an input pad. FIG. 9 is a circuit diagram of an ESD protection circuit 500 for an input pad that utilizes silicon controlled rectifier devices for silicon-on-insulator (SOI) CMOS processes according to the present invention. As shown in FIG. 9, the circuit design 500 is installed between a pair of power terminals ($V_{SS}$ and $V_{DD}$). An internal circuit 502 is electrically connected to an input pad 504. A SOI-NSCR device 506 is electrically connected between the $V_{SS}$ power terminal and the input pad 504. The anode of the SOI-NSCR device 506 is electrically connected to the input pad 504, and the cathode of the SOI-NSCR device 506 is electrically connected to the $V_{SS}$ power terminal. A SOI-PSCR device 508 is electrically connected between the input pad 504 and the $V_{DD}$ power terminal. The anode of the SOI-PSCR device 508 is electrically connected to the $V_{DD}$ power terminal, and the cathode of the SOI-PSCR device 508 is electrically connected to the input pad 504. A first diode (Dn1) 512 is electrically connected between the $V_{SS}$ power terminal and the input pad 504, and a second diode (Dp1) 514 is electrically connected between the input pad 504 and the $V_{DD}$ power terminal. A first dummy gate (G1) installed on the SOI-NSCR device 506 is electrically connected to the input pad 504 through a first resistor (Rn1) 516. A first gate (G2) installed on the SOI-NSCR device 506 is electrically connected to the $V_{SS}$ power terminal through a second resistor (Rn2) 518. A second dummy gate (G2) installed on the SOI-PSCR device 508 is electrically connected to the input pad 504 through a third resistor (Rp1) 522. A second gate (G1) installed on the SOI-PSCR device 508 is electrically connected to the $V_{DD}$ power terminal through a fourth resistor (Rp2) 524. Moreover, the ESD protection circuit further comprises a power-rail ESD clamp circuit 999 electrically connected between the $V_{SS}$ power terminal and the $V_{DD}$ power terminal.

When there is a positive ESD pulse relative to $V_{SS}$, the SOI-NSCR device 506 turns on and the ESD-induced current is discharged through this SOI-NSCR device 506. When there is a negative ESD pulse relative to $V_{SS}$, Dn1 512 turns on and the ESD current is discharged through Dn1 512. When there is a negative ESD pulse relative to $V_{DD}$, the SOI-PSCR device 508 turns on to discharge the ESD current. When there is a positive ESD pulse relative to $V_{DD}$, Dp1 514 turns on and the ESD current is discharged through Dp1 514. In a normal operational mode, Dn1 512, Dp1 514, SOI-NSCR 506 and SOI-PSCR 508 are all kept off.

Figure 10:
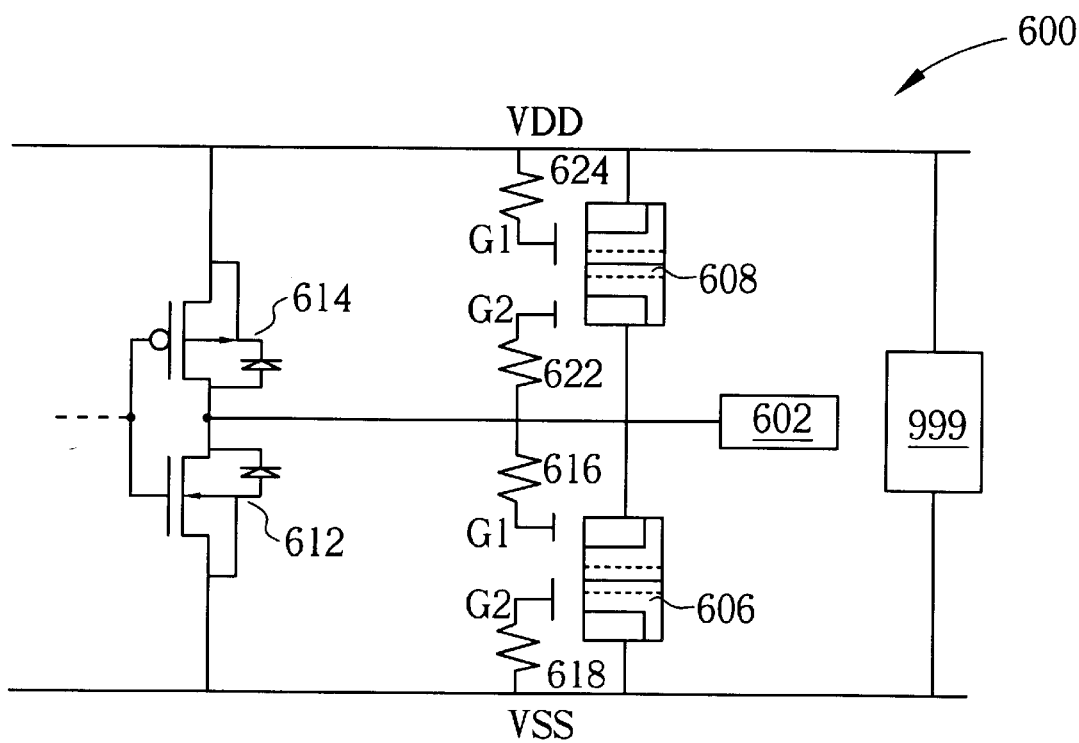
FIG. 10 is a circuit diagram of an ESD protection circuit for an output pad that utilizes silicon controlled rectifier devices in a SOI CMOS process according to the present invention.

Please refer to FIG. 10. FIG. 10 is a circuit diagram for an ESD protection circuit 600 for an output pad that utilizes silicon controlled rectifier devices for silicon-on-insulator (SOI) CMOS processes according to the present invention. In this circuit 600 for an output pad 602, the design ideas are the same as for the ESD protection circuit 500 for an input pad. When there is a positive ESD pulse relative to $V_{SS}$, the SOI-NSCR device 606 turns on and the ESD-induced current is discharged through the SOI-NSCR device 606. When there is a negative ESD pulse relative to $V_{SS}$, Dn1 612 turns on and the ESD current is discharged through Dn1 612. When there is a negative ESD pulse relative to $V_{DD}$, the SOI-PSCR device 608 turns on to discharge the ESD current. When there is a positive ESD pulse relative to $V_{DD}$, Dp1 614 turns on and the ESD current is discharged through Dp1 614. In normal operational modes, Dn1 612, Dp1 614, SOI-NSCR 606 and SOI-PSCR 608 are all kept off.

Please refer to FIG. 11(*a*) to FIG. 11(*g*). FIG. 11(*a*) to FIG. 11(*g*) are circuit diagrams of ESD protection circuits 700, 750, 800, 850, 900, 950, 1000 utilized between power rails that take advantage of silicon controlled rectifier devices for silicon-on-insulator (SOI) CMOS processes according to the present invention. As shown in FIG. 11(a), the circuit design 700 is installed between a pair of power terminals ($V_{SS}$ and $V_{DD}$). A capacitor C 704 is electrically connected between the $V_{SS}$ power terminal and a first node 708. A resistor R1 706 is electrically connected between the first node 708 and the $V_{DD}$ power terminal. A first block 702, comprising a first inverter 703, is electrically connected between the first node 708 and the a node 710. The input of the first inverter 703 is connected to the first node 708. The first node 708 is biased by the capacitor C 704, and the voltage is sustained by the first resistor R1 706. The output of the first inverter 703 is connected to the second node 710. A second block 712, comprising a SOI-NSCR device 714 and a diode string 716, is electrically connected to the output of the first inverter 703 at the second node 710. The second block 712 is an ESD protection device that includes the SOI-NSCR device 714 and the diode string 716. The SOI-NSCR device 714 comprises a gate (G2) electrically connected to the second node 710, and a dummy gate (G1) electrically connected to the $V_{DD}$ terminal through a resistor R2 718. The SOI-NSCR device 714 also comprises a P-well and an N-well junction.

In normal operational modes, the first node 708 remains at a high voltage level. The second node 710 remains at a low voltage level due to the first inverter 703. The NMOS (not shown) incorporated in the SOI-NSCR device 714 is in its off state, and the SOI-NSCR device 714 is therefore kept off. Under an ESD-stress condition, when there is a positive ESD pulse across the $V_{DD}$ and $V_{SS}$ power rails, the first node 708 is initially at a low voltage level, and the second node 710 turns to at high voltage level from the operation of the inverter. The NMOS (not shown) in the SOI-NSCR device 714 turns on, and current passes from the N-well into the P-well, producing a voltage drop. This causes a forward bias, which results in the turning on of the SOI-NSCR device 714. The ESD current is discharged from $V_{DD}$ to $V_{SS}$ power rails through the SOI-NSCR device 714 and the diode string (D1 to Dn) 716. The function of the diode string 716 is to raise the holding voltage between the $V_{DD}$ and $V_{SS}$ power rails after the SOI-NSCR 714 turns on to avoid latch-up problems. The diode string (D1 to Dn) 716 prevents the SOI-NSCR device 714 from latching up in normal operational modes from triggering caused by a noise pulse. The resistor R2 718 protects the gate insulator (not shown) of the dummy gate (G1).

Figure 11A:
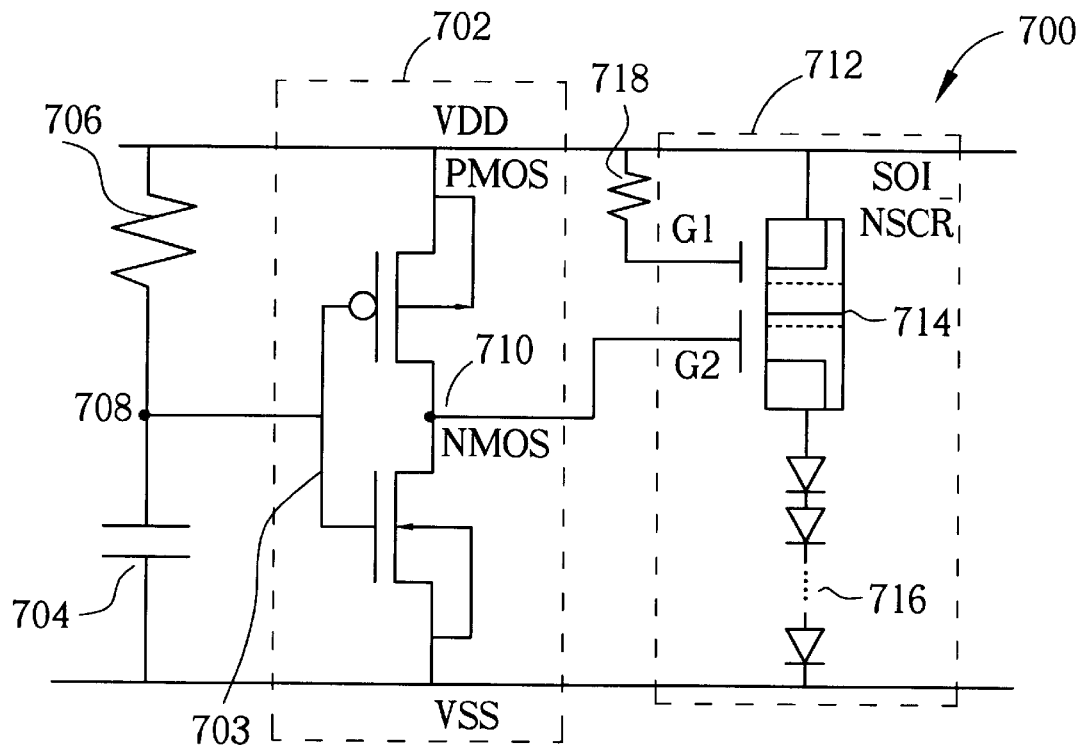
FIG. 11(a) to FIG. 11(g) are circuit diagrams of an ESD protection circuits used between power rails that utilize silicon controlled rectifier devices in a SOI CMOS process according to the present invention.
Figure 11B:
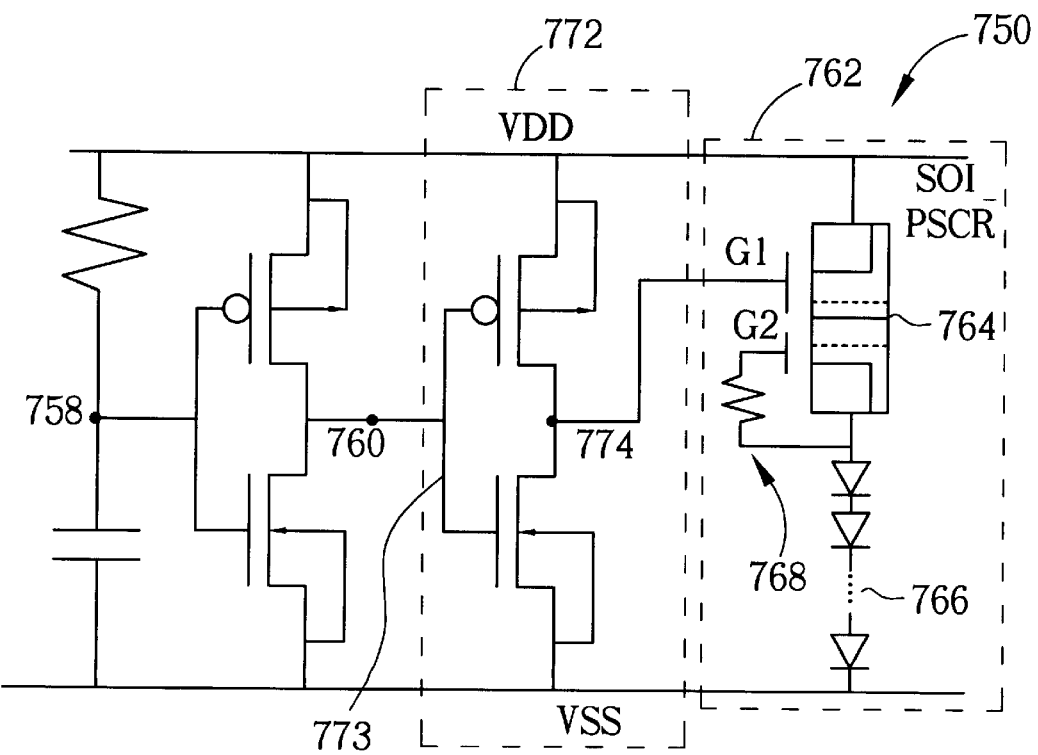

As shown in FIG. 11(b), a third block 772 comprises a second inverter 773 that is electrically connected between the second node 760 and the second block (ESD protection device) 762. The input of the third block 772 is electrically connected to the second node 760, and the output of the third block 772 is electrically connected to the ESD protection device. The second block 762 comprises a SOI-PSCR device 764 and a diode string 766. The SOI-PSCR device 764 comprises a gate (G1) electrically connected to a third node 774, and a dummy gate (G2) electrically connected to the diode string 766 through a resistor R2 768. The SOI-PSCR device 764 also comprises a P-well and an N-well junction.

In normal operational modes, the first node 758 remains at a high voltage level. The third node 774 is at a high voltage level after operation of the two inverters, and keeps a PMOS (not shown) turned off, which is in the SOI-PSCR device 764. Therefore, the SOI-PSCR device 764 is also kept off. Under an ESD-stress condition, when there is a positive ESD pulse across the $V_{DD}$ and $V_{SS}$ power rails, the first node 758 is initially at a low voltage level. The third node 774 is at a low voltage level due to the two inverters. The PMOS (not shown) in the SOI-PSCR device 764 turns on, and current passes from the N-well into the P-well, producing a voltage drop. This voltage drop causes a forward bias, resulting in the turning on of the SOI-PSCR device 764. The ESD current is discharged through the SOI-PSCR device 764 and the diode string (D1 to Dn) 766. The function of the diode string 766 is to raise the holding voltage between the $V_{DD}$ and $V_{SS}$ power rails to avoid latch-up problems. This prevents the SOI-PSCR device 764 from latching up in normal operational modes when triggered on by a noise pulse. The resistor R2 768 protects the gate insulator (not shown) of the dummy gate (G2).

Figure 11C:
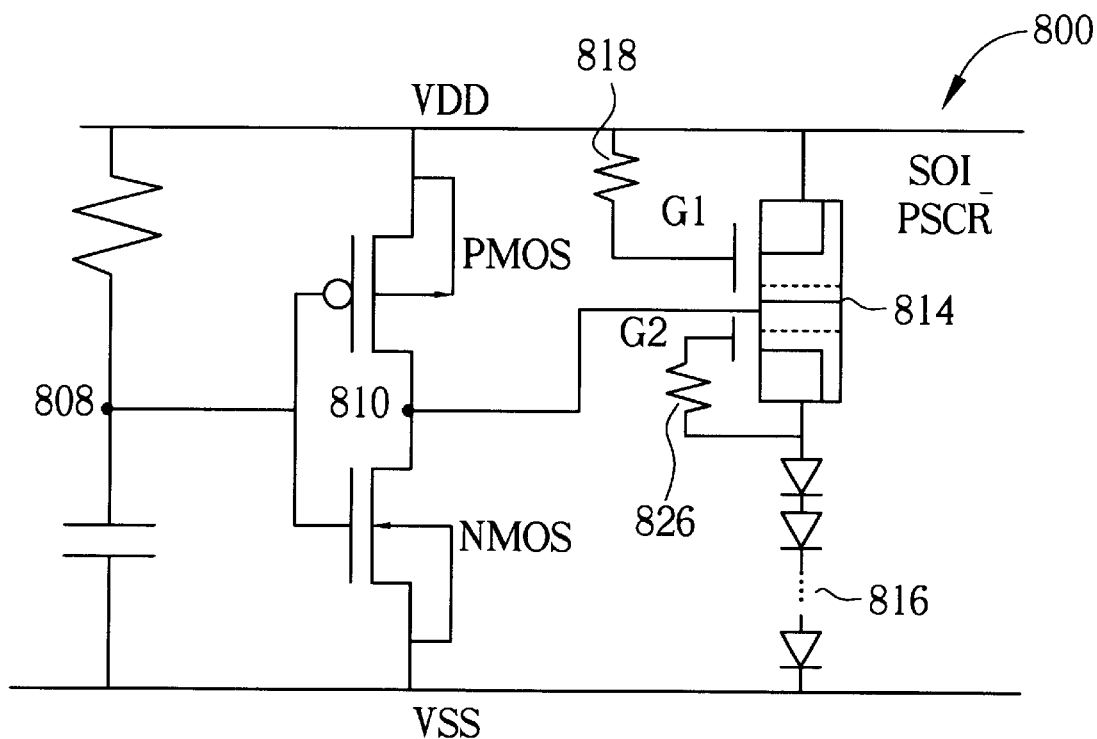

As shown in FIG. 11(c), the heavily doped P-type region of a SOI-PSCR device 814 is electrically connected to the second node 810. The gate (G1) is electrically connected to $V_{DD}$ through a resistor (R2) 818. In normal operational modes, the first node 808 remains at a high voltage level. The second node 810 is at a low voltage level due to the inverter, and no forward bias occurs at the P3-N1 junction in the SOI-PSCR device 814. The SOI-PSCR device 814 is thus in an off state. Under an ESD-stress condition, when there is a positive ESD pulse across the $V_{DD}$ and $V_{SS}$ power rails, the first node 808 is initially at a low voltage level, which turns the PMOS on and the NMOS off. The P3-N1 junction is triggered to cause a forward bias, resulting in a turning on of the SOI-PSCR device 814 and diode string 816 to shunt the ESD current. R2 818 and R3 826 are used to protect the gate insulator (not shown) from electrical stress.

Figure 11D:
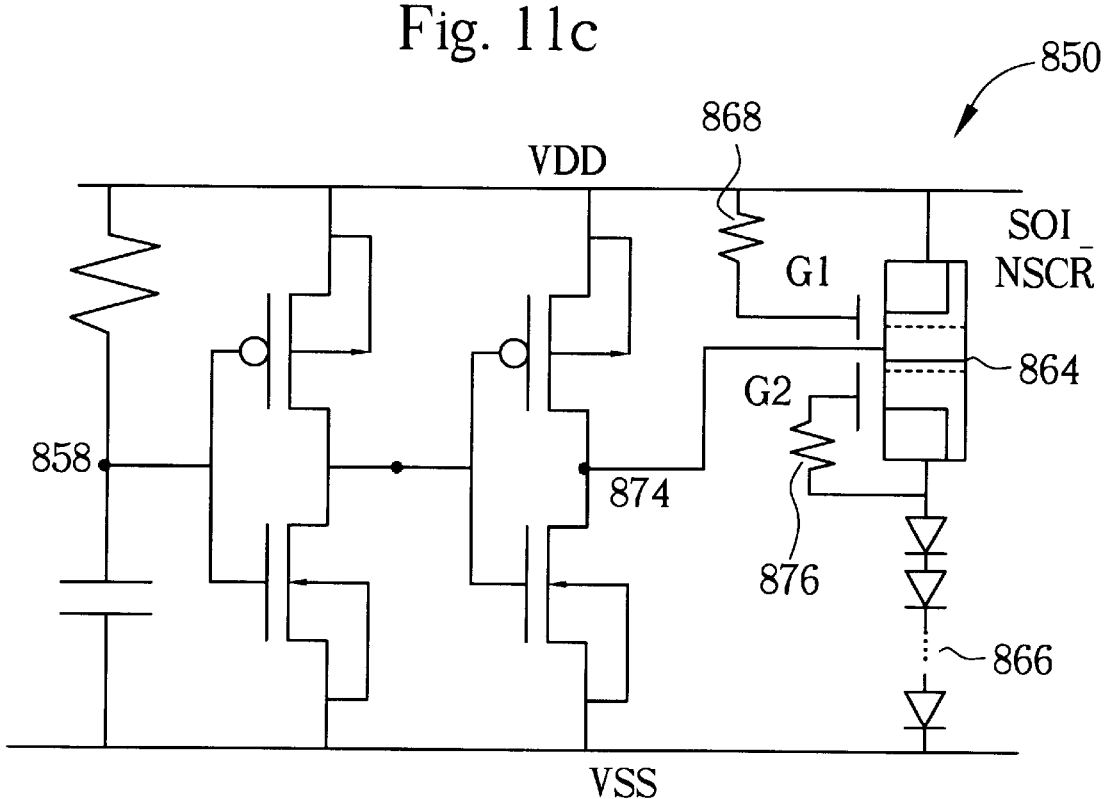

As shown in FIG. 11(d), the heavily doped N-type region of a SOI-NSCR device 864 is electrically connected to a third node 874. The gate (G2) is connected to diode string 866 through a resistor R3 876. In normal operational modes, the first node 858 remains at a high voltage level. The third node 874 is at a high voltage level due to the operation of the two inverters. In this condition, the SOI-NSCR device 864 is kept off. Under an ESD-stress event, when there is a positive ESD pulse across the $V_{DD}$ and $V_{SS}$ power rails, the first node 858 is initially at a low voltage level. The third node 874 is at a low voltage level due to the two inverters. The N3-P2 junction of the SOI-NSCR device 864 is triggered to cause a forward bias, which turns on the SOI-NSCR device 864 and the diode string (D1 to Dn) 866 to shunt the ESD current. R2 868 and R3 876 are used to protect the gate insulator (not shown) from electrical stress.

Figure 11E:
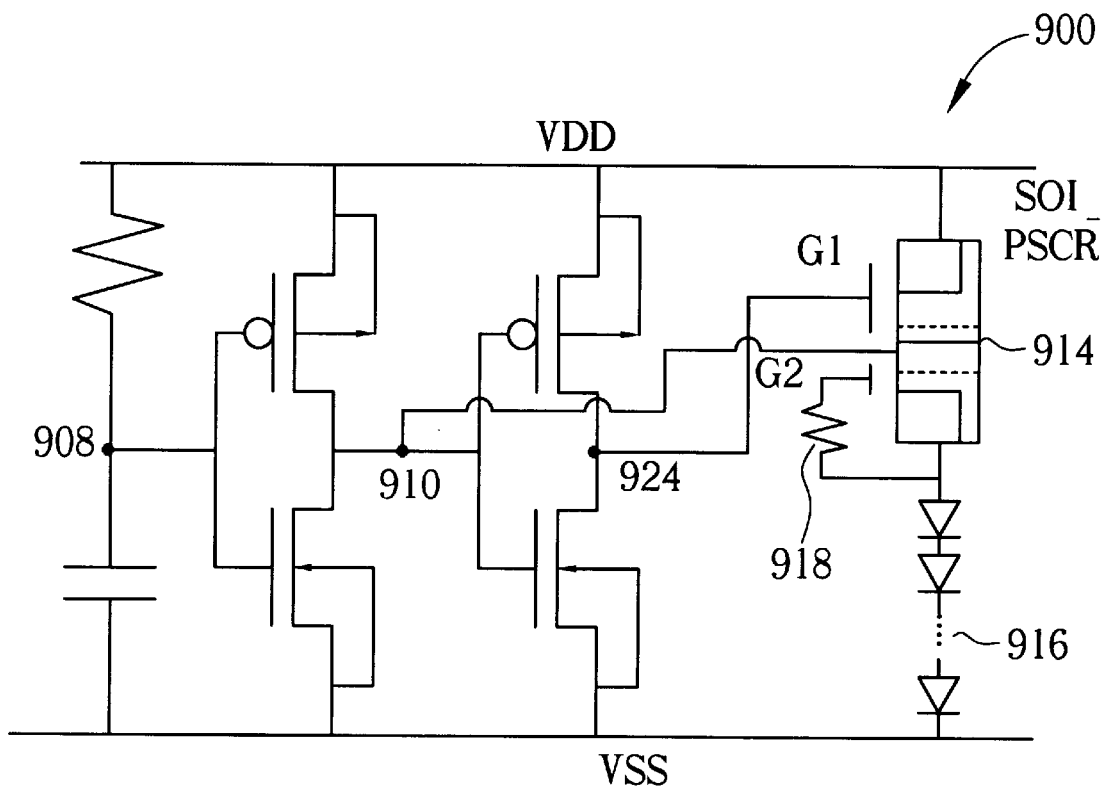

As shown in FIG. 11(e), the gate (G1) of a SOI-PSCR device 914 is connected to a third node 924. The heavily doped P-type region of the SOI-PSCR device 914 is electrically connected to a second node 910. In normal operational modes, a first node 910 remains at a high voltage level and keeps the second node 924 at a low voltage due to the operation of a single inverter. The P-N junction is not forward biased because the second node 910 is at a low voltage. The third node 924 is at a high voltage level after the operation of two inverters, and causes a PMOS (not shown) in the SOI-PSCR device 914 to be turned off. Therefore, the SOI-PSCR device 914 is also in an off state.

Under ESD-stress conditions, when there is a positive ESD pulse across the $V_{DD}$ and $V_{SS}$ power rails, the first node 908 is initially at a low voltage level, and the second node 910 is at a high voltage level from the single inverter. The P-N junction is forward biased due to the second node 910 being at a high voltage level. The third node 924 is at a low voltage level after the two inverters. The PMOS (not shown) in the SOI-PSCR device 914 turns on, and current passes from the N-well into the P-well to produce a voltage drop.

This voltage drop causes a forward bias, resulting in a turning on of the SOI-PSCR device 914. By both turning on the PMOS (not shown), and forward-biasing the P3-N1 junction, the reaction time to turn on the SOI-PSCR device 914 is reduced. The ESD current is discharged through the SOI-PSCR device 914 and the diode string (D1 to Dn) 916. The function of the diode string 916 is to raise the holding voltage between the $V_{DD}$ and $V_{SS}$ power rails to avoid latch-up problems. This prevents the SOI-PSCR device 914 from latching up under normal operational modes when triggered on by a noise pulse. The resistor R2 918 protects the gate insulator (not shown) of the dummy gate.

Figure 11F:
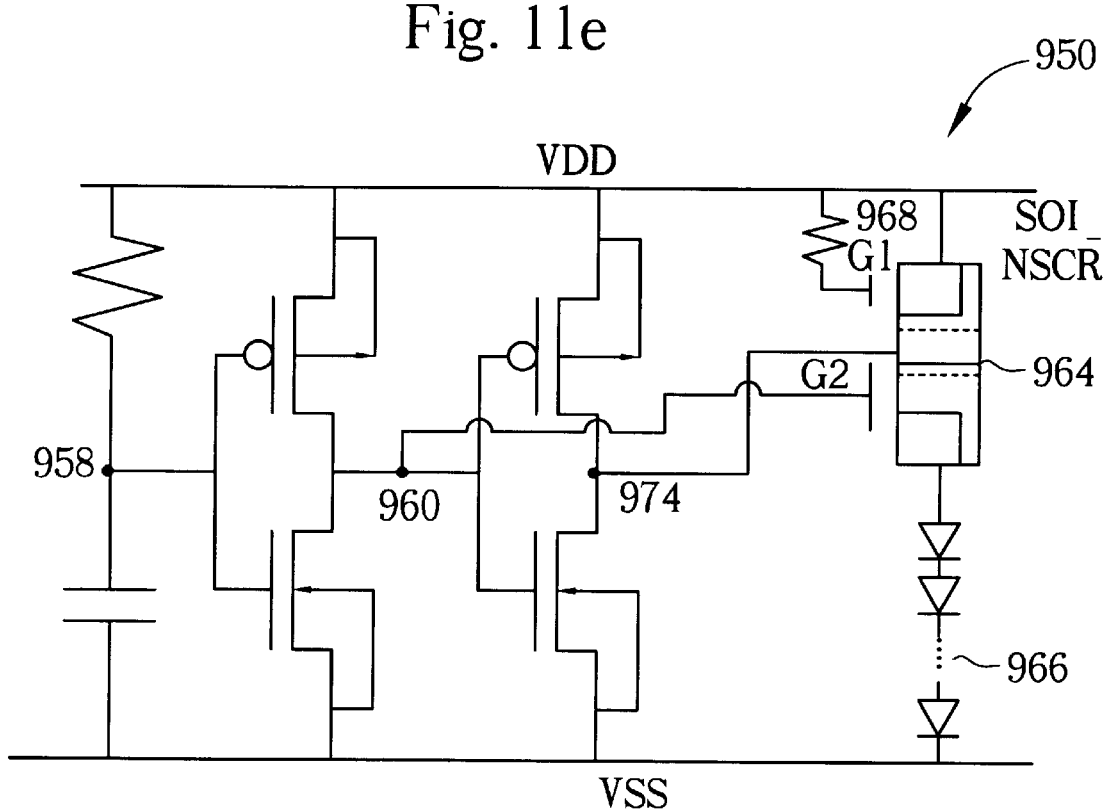
Figure 11G:
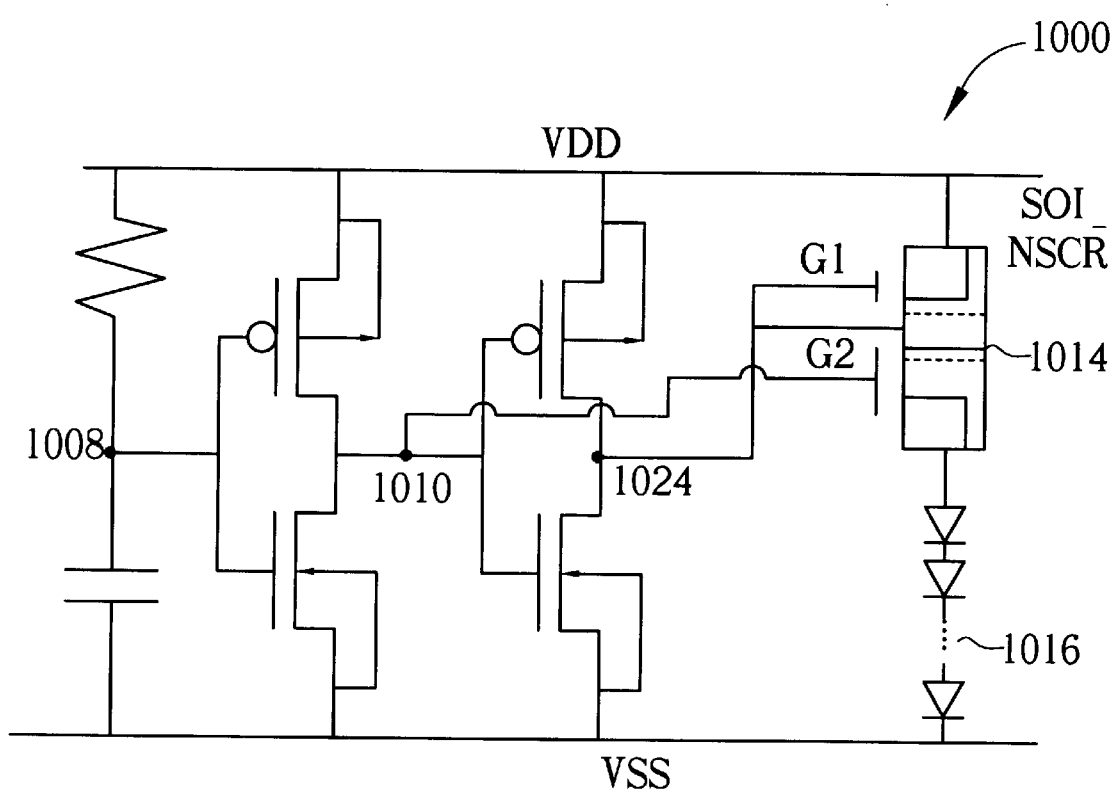

As shown in FIG. 11(f), the gate (G2) of a SOI-NSCR device 964 is electrically connected to a second node 960. The heavily doped N-type region is electrically connected to a third node 974. In normal operational modes, a first node 958 remains at high voltage level. The second node 960 is at a low voltage level due to the operation of a first inverter. An NMOS (not shown) in the SOI-NSCR 964 is kept off due to the second node 960 being at a low voltage level. The third node 974 is at a high voltage level after the operation of two inverters. Under these conditions, the SOI-NSCR device 964 is kept off. Under an ESD-stress condition, when there is a positive ESD pulse across the $V_{DD}$ and $V_{SS}$ power rails, the first node 958 is initially at a low voltage level, and the second node 960 is at a high voltage level from the first inverter. The NMOS turns on, and current triggers the SOI-NSCR device 964 to turn on. The third node 974 is at a low voltage level from the two inverters. The N3-P2 junction is triggered to cause a forward bias, resulting in the turning on of the SOI-NSCR device 964 and diode string (D1 to Dn) 966 to shunt the ESD current. By both turning on the NMOS and forward-biasing the N3-P2 junction, a reduction in the reaction time for turning on the SOI-NSCR device 964 is achieved. The resistor R2 968 is used to protect the gate insulator (not shown) from electrical stress.

As shown in FIG. 11(g,), the gate (G2) of a SOI-NSCR device 1014 is electrically connected to a second node 1010. The heavily doped N-type region and the dummy gate (G1) are electrically connected to a third node 1024. In normal operational modes, the first node 1008 remains at a high voltage level. A second node 1010 is at a low voltage level after the operation of a first inverter. An NMOS (not shown) in the SOI-NSCR device 1014 is kept off due to the second node 1010 being at a low voltage level. The third node 1024 is at a high voltage level after the operation of two inverters. Under these conditions, the SOI-NSCR device 1014 is in an off state. Under ESD-stress conditions, when there is a positive ESD pulse across the $V_{DD}$ and $V_{SS}$ power rails, the first node 1008 is initially at a low voltage level, and the second node 1010 is at a high voltage level from the operation of the first inverter. The NMOS turns on, and current triggers the SOI-NSCR device 1014 to turn on. The third node 1024 is at a low voltage level after operation of the two inverters. The N3-P2 junction is triggered to cause a forward bias, resulting in the turning on of the SOI-NSCR device 1014 and the diode string (D1 to Dn) 1016 to bypass the ESD current. The dummy gate (G1) is also triggered by the third node 1024. By both triggering gates G1 and G2, and by forward biasing the N3-P2 junction of the SOI-NSCR device 1014, a reduction of the reaction time for turning on the SOI-NSCR device 1014 is achieved.

In summary, the present invention provides a SCR structure for ESD protection circuits that is realized for SOI CMOS processes. Also, poly-silicon gates are used to block the STI region in a SOI CMOS process. Therefore, not only may the SCR device be realized with a compact structure, but also a quick turn-on speed for ESD protection circuit purposes can be achieved.

In contrast to the prior method of making SCR structures for ESD protection circuits, the present invention SOI-NSCR and SOI-PSCR may be integrated in fully-depleted SOI CMOS processes and in partially-depleted SOI CMOS processes to form electrostatic discharge protection circuits. Furthermore, poly-silicon gates are used to block STI regions in the SOI CMOS process of the present invention. Hence, not only can the SCR device be realized with a compact structure, but also quick turn-on speeds for ESD protection circuit purposes can be achieved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An NMOS-trigger silicon controlled rectifier in silicon-on-insulator (SOI-NSCR), the SOI-NSCR comprising:
   a P-type well and an N-type well in a substantially single crystal silicon layer on a surface of a silicon-on-insulator substrate;
   a first P$^+$ doping region and a first N$^+$ doping region in the N-type well for use as an anode of the SOI-NSCR;
   a second P$^+$ doping region and a second N$^+$ doping region in the P-type well for use as a cathode of the SOI-NSCR, the first P$^+$ doping region, the N-type well, the P-type well and the second N$^+$ doping region forming a lateral silicon controlled rectifier (SCR);
   a third N$^+$ doping region across the N-type well and the P-type well;
   a gate in the P-type well and the third N$^+$ doping region, the gate and the second By N$^+$ doping region forming an NMOS; and
   a dummy gate in the N-type well for isolating the first P$^+$ doping region and the third N$^+$ doping region.

2. The SOI-NSCR of claim 1 wherein when a positive transient voltage is applied across the anode and the cathode of the SOI-NSCR, the positive transient voltage generates a current flowing from the first P$^+$ doping region to the N-type well.

3. The SOI-NSCR of claim 2 wherein when the positive transient voltage is greater than a junction breakdown voltage of the P-type well and the third N$^+$ doping region, the junction breaks down so that the current incurred from the positive transient voltage flows across the junction and is discharged to the cathode through the second N$^+$ doping region.

4. The SOI-NSCR of claim 1 wherein when a voltage is applied to the gate of the NMOS that turns on the NMOS, a forward bias is created that causes the SOI-NSCR to turn on, and current incurred from a positive transient voltage across the anode and the cathode is discharged to the cathode across a junction of the P-type well and the third N$^+$ doping region.

5. The SOI-NSCR of claim 1 wherein the third N$^+$ doping region is used as an N trigger node, a voltage applied to the third N$^+$ doping region generating a trigger current through the N trigger node to cause the lateral SCR to enter a latch state and to quickly trigger on the SOI-NSCR, and current incurred from a positive transient voltage across the anode and the cathode is discharged to the cathode across a junction of the P-type well and the third N$^+$ doping region.

6. The SOI-NSCR of claim 1 wherein when a negative transient voltage is applied across the anode and the cathode of the SOI-NSCR, the negative transient voltage generates a current flowing from the second P+ doping region to the P-type well, and a junction of the P-type well and the N-type well is forward biased so that the current incurred from the negative transient voltage flows from the N-type well to the anode through the first N+ doping region.

7. The SOI-NSCR of claim 1 wherein the junction of the third N+ doping region and the P-type well is utilized for reducing the trigger voltage for the SOI-NSCR device.

8. The SOI-NSCR of claim 1 wherein the junction breakdown voltage for the P-type well and the third N+ doping region is lower than the junction breakdown voltage for the P-type well and the N-type well.

9. The SOI-NSCR of claim 1 wherein the SOI-NSCR further comprises at least one spacer surrounding each gate.

10. The SOI-NSCR of claim 9 wherein the SOI-NSCR further comprises a lightly doped drain (LDD) underneath each spacer.

11. The SOI-NSCR of claim 1 wherein the first P+ doping region, the second P+ doping region, the first N+ doping region and the second N+ doping region are not in contact with the isolator in the SOI substrate so that the SOI-NSCR is capable of integration in a partially-depleted SOI CMOS process.

12. The SOI-NSCR of claim 1 wherein the first P+ doping region, the second P+ doping region, the first N+ doping region and the second N+ doping region are in contact with the isolator in the SOI substrate so that the SOI-NSCR is capable of integration in a fully-depleted SOI CMOS process.

13. A PMOS-trigger silicon controlled rectifier in silicon-on-insulator (SOI-PSCR), the SOI-PSCR comprising:
   a P-type well and an N-type well in a substantially single crystal silicon layer on a surface of a silicon-on-insulator substrate;
   a first P+ doping region and a first N+ doping region in the N-type well for use as an anode of the SOI-PSCR;
   a second P+ doping region and a second N+ doping region in the P-type well for use as a cathode of the SOI-PSCR, the first P+ doping region, the N-type well, the P-type well and the second N+ doping region forming a lateral silicon controlled rectifier (SCR);
   a third P+ doping region across the N-type well and the P-type well;
   a gate in the N-type well and the third P+ doping region, the gate and the first P+ doping region forming a PMOS; and
   a dummy gate in the P-type well for isolating the second N+ doping region and the third P+ doping region.

14. The SOI-PSCR of claim 13 wherein when a positive transient voltage is applied across the anode and the cathode of the SOI-PSCR, the positive transient voltage generates a current flowing from the first P+ doping region to the N-type well.

15. The SOI-PSCR of claim 14 wherein when the positive transient voltage is greater than a junction breakdown voltage of the N-type well and the third P+ doping region, the junction breaks down so that the current incurred from the positive transient voltage flows across the junction and is discharged to the cathode through the second N+ doping region.

16. The SOI-PSCR of claim 13 wherein when a voltage is applied to the gate of the PMOS that turns on the PMOS, a forward bias is generated that turns on the SOI-PSCR, and a current incurred from a positive transient voltage across the anode and the cathode is discharged to the cathode across a junction of the N-type well and the third P+ doping region.

17. The SOI-PSCR of claim 13 wherein the third P+ doping region is used as a P trigger node, a voltage applied to the third P+ doping region generating a trigger current through the P trigger node that causes the lateral SCR to enter a latch state and trigger on to quickly turn on the SOI-PSCR, and current incurred from a positive transient voltage applied across the anode and the cathode is discharged to the cathode across a junction of the N-type well and the third P+ doping region.

18. The SOI-PSCR of claim 13 wherein when a negative transient voltage is applied across the anode and the cathode of the SOI-PSCR, the negative transient voltage generates a current flowing from the second P+ doping region to the P-type well, and a junction of the P-type well and the N-type well is forward biased so that the current incurred from the negative transient voltage flows from the N-type well to the anode through the first N+ doping region.

19. The SOI-PSCR of claim 13 wherein a junction of the third P+ doping region and the N-type well is utilized for reducing a trigger voltage for the SOI-PSCR.

20. The SOI-PSCR of claim 13 wherein a junction breakdown voltage for the N-type well and the third P+ doping region is lower than a junction breakdown voltage for the P-type well and the N-type well.

21. The SOI-PSCR of claim 13 wherein the SOI-PSCR further comprises at least one spacer surrounding each gate.

22. The SOI-PSCR of claim 21 wherein the SOI-PSCR further comprises a lightly doped drain (LDD) underneath each spacer.

23. The SOI-PSCR of claim 13 wherein the first P+ doping region, the second P+ doping region, the first N+ doping region and the second N+ doping region are not in contact with the isolator in the SOI substrate so that the SOI-PSCR is capable of integration in a partially-depleted SOI CMOS process.

24. The SOI-PSCR of claim 13 wherein the first P+ doping region, the second P+ doping region, the first N+ doping region and the second N+ doping region are in contact with the isolator in the SOI substrate so that the SOI-PSCR is capable of integration in a fully-depleted SOI CMOS process.

25. An electrostatic discharge (ESD) protection circuit adapted to electrically connect to an I/O pad, a $V_{SS}$ power terminal, and a $V_{DD}$ power terminal, the ESD protection circuit comprising:
   an NMOS-trigger silicon controlled rectifier in silicon-on-insulator (SOI-NSCR), an anode of the SOI-NSCR electrically connected to the I/O pad, a cathode of the SOX-NSCR electrically connected to the $V_{SS}$ power terminal;
   a PMOS-trigger silicon controlled rectifier in silicon-on-insulator (SOI-PSCR), the anode of the SOI-PSCR electrically connected to the $V_{DD}$ power terminal, a cathode of the SOI-PSCR electrically connected to the I/O pad;
   a first diode, an anode of the first diode electrically connected to the $V_{SS}$ power terminal, a cathode of the first diode electrically connected to the I/O pad;
   a second diode, an anode of the second diode electrically connected to the I/O pad, a cathode of the second diode electrically connected to the $V_{DD}$ power terminal;
   a first resistor electrically connecting the I/O pad to a first dummy gate of the SOI-NSCR, and a second resistor electrically connecting the $V_{SS}$ power terminal to a first gate of the SOI_NSCR; and
   a third resistor electrically connecting the I/O pad to the second dummy gate of the SOI_PSCR, and a fourth resistor electrically connecting the $V_{DD}$ power terminal to the second gate of the SOI_PSCR.

26. The ESD protection circuit of claim 25 wherein the SOI-NSCR comprises:

a first P-type well and a first N-type well in a substantially single crystal silicon layer on a surface of a silicon-on-insulator substrate;

a first P$^+$ doping region and a first N$^+$ doping region in the first N-type well for use as the anode of the SOI-NSCR;

a second P$^+$ doping region and a second N$^+$ doping region in the first P-type well for use as the cathode of the SOI-NSCR, the first P$^+$ doping region, the first N-type well, the first P-type well and the second N$^+$ doping region forming a lateral silicon controlled rectifier (SCR);

a third N$^+$ doping region across the N-type well and the P-type well;

the first gate in the first P-type well and the third N$^+$ doping region, the first gate and the second N$^+$ doping region forming an NMOS; and the first dummy gate in the first N-type well for isolating the first P$^+$ doping region and the third N$^+$ doping region.

27. The ESD protection circuit of claim 25 wherein the SOI-PSCR comprises:

a second P-type well and a second N-type well in a substantially single crystal silicon layer on a surface of a silicon-on-insulator substrate;

a third P$^+$ doping region and a fourth N$^+$ doping region in the second N-type well for use as the anode of the SOI-PSCR;

a fourth P$^+$ doping region and a fifth N$^+$ doping region in the second P-type well for use as the cathode of the SOI-PSCR, the third P$^+$ doping region, the second N-type well, the second P-type well and the fifth N$^+$ doping region forming a lateral silicon controlled rectifier (SCR);

a fifth P$^+$ doping region across the second N-type well and the second P-type well;

the second gate in the second N-type well and the fifth P$^+$ doping region, the second gate and the third P$^+$ doping region forming a PMOS; and the second dummy gate in the second P-type well for isolating the fifth N$^+$ doping region and the fifth P$^+$ doping region.

28. A power-rail ESD protection circuit for use with a power-rail, the ESD protection circuit comprising:

a first inverter, the first inverter comprising an input node and an output node;

a capacitor electrically connected to the input node and a $V_{SS}$ power terminal of the power-rail;

a first resistor electrically connected to the input node and a $V_{DD}$ power terminal of the power-rail;

a SOI_NSCR, an anode of the SOI_NSCR electrically connected to the $V_{DD}$ power terminal, the SOI_NSCR comprising:

a first P-type well and a first N-type well in a substantially single crystal silicon layer on a surface of a silicon-on-insulator substrate;

a first P$^+$ doping region and a first N$^+$ doping region in the first N-type well for use as the anode of the SOI-NSCR;

a second P$^+$ doping region and a second N$^+$ doping region in the first P-type well for use as a cathode of the SOI-NSCR, the first P$^+$ doping region, the first N-type well, the first P-type well and the second N$^+$ doping region forming a lateral SCR;

a third N$^+$ doping region across the N-type well and the P-type well;

a first gate in the first P-type well and the third N$^+$ doping region, the first gate and the second N$^+$ doping region forming an NMOS; and a first dummy gate in the first N-type well for isolating the first P$^+$ doping region and the third N$^+$ doping region;

a diode string electrically connected between the cathode of the SOI_NSCR and the $V_{SS}$ power terminal;

wherein the diode string is utilized to raise a holding voltage after the SOI_NSCR is turned on to prevent the SOI_NSCR from being triggered on and entering a latch up state by a noise pulse when in a normal operating mode.

29. The ESD protection circuit of claim 28 further comprising a second resistor for electrically connecting the $V_{DD}$ power terminal to the first dummy gate to protect a gate oxide layer in the first dummy gate.

30. The ESD protection circuit of claim 28 further comprising a third resistor for electrically connecting the diode string to the first gate to protect a gate oxide layer in the first gate.

31. The ESO protection circuit of claim 28 wherein the first gate is electrically connected to the output node of the first inverter.

32. The ESD protection circuit of claim 28 wherein the third N$^+$ doping region is electrically connected to the output node of the first inventor.

33. The ESD protection circuit of claim 32 further comprising a second inverter, an input node of the second inverter electrically connected to the capacitor and the first resistor, an output node of the second inverter electrically connected to the input node of the first inverter.

34. The ESD protection circuit of claim 32 further comprising a second inverter, an input node of the second inverter electrically connected to the capacitor and the first resistor, an output node of the second inverter electrically connected to the input node of the first inverter and the first gate.

35. The ESD protection circuit of claim 32 further comprising a second inverter, an input node of the second inverter electrically connected to the capacitor and the first resistor, an output node of the second inverter electrically connected to the input node of the first inverter and the first gate, the output node of the first inverter electrically connected to the first dummy gate.

36. A power-rail ESD protection circuit for use with a power-rail, the ESD protection circuit comprising:

a first inverter, the first inverter comprising an input node and an output node;

a capacitor electrically connected to the input node and a $V_{SS}$ power terminal of the power-rail;

a first resistor electrically connected to the input node and a $V_{DD}$ power terminal of the power-rail;

a SOI_PSCR, an anode of the SOI_PSCR electrically connected to the $V_{DD}$ power terminal, the SOI_PSCR comprising:

a second P-type well and a second N-type well in a substantially single crystal silicon layer on a surface of a silicon-on-insulator substrate;

a third P$^+$ doping region and a fourth N$^+$ doping region in the second N-type well for use as the anode of the SOI-PSCR;

a fourth P+ doping region and a fifth N+ doping region in the second P-type well for use as a cathode of the SOI-PSCR, the third P+ doping region, the second N-type well, the second P-type well and the fifth N+ doping region forming a lateral SCR;

a fifth P+ doping region across the second N-type well and the second P-type well;

a second gate in the second N well and the fifth P+ doping region, the second gate and the third P+ doping region forming a PMOS; and a second dummy gate in the second P-type will for isolating the fifth N+ doping region and the fifth P+ doping region;

a diode string electrically connected between the cathode of the SOI_PSCR and the $V_{SS}$ power terminal;

wherein the diode string is utilized to raise a holding voltage after the SOI_PSCR is turned on to prevent the SOI_PSCR from being triggered on and entering a latch up state by a noise pulse when in a normal operating mode.

37. The ESD protection circuit of claim 36 further comprising a fourth resistor for electrically connecting the diode string to the second dummy gate to protect a gate oxide layer in the second dummy gate.

38. The ESD protection circuit of claim 36 further comprising a fifth resistor for electrically connecting the $V_{DD}$ power terminal to the second gate to protect a gate oxide layer in the second gate.

39. The ESD protection circuit of claim 36 wherein the second gate is electrically connected to the output node of the first inverter.

40. The ESD protection circuit of claim 39 further comprises a third inverter, an input node of the third inverter electrically connected to the capacitor and the first resistor, an output node of the third inverter electrically connected to the input node of the first inverter.

41. The ESD protection circuit of claim 36 wherein the fifth P+ doping region is electrically connected to the output node of the first inverter.

42. The ESD protection circuit of claim 41 further comprising a third inverter, an input node of the third inverter electrically connected to the output node of the first inverter, an output node of the third inverter electrically connected to the second gate.

43. An electrostatic discharge (ESD) protection circuit adapted to electrically connect to an pad, a $V_{SS}$ power terminal, and a $V_{DD}$ power terminal, the ESD protection circuit comprising:

an NMOS-trigger silicon controlled rectifier in silicon-on-insulator (SOI-NSCR), an anode of the SOI-NSCR electrically connected to the I/O pad, a cathode of the SOI-NSCR electrically connected to the $V_{SS}$ power terminal;

a PMOS-trigger silicon controlled rectifier in Bilicon-on-insulator (SOI-PSCR), the anode of the SOI-PSCR electrically connected to the $V_{DD}$ power terminal, a cathode of the SOI-PSCR electrically connected to the I/O pad;

a first diode, an anode of the first diode electrically connected to the $V_{SS}$ power terminal, a cathode of the first diode electrically connected to the I/O pad;

a second diode, an anode of the second diode electrically connected to the I/O pad, a cathode of the second diode electrically connected to the $V_{DD}$ power terminal;

a first resistor electrically connecting the I/O pad to a first dummy gate of the SOI-NSCR, and a second resistor electrically connecting the $V_{SS}$ power terminal to a first gate of the SOI_NSCR; and a third resistor electrically connecting the I/O pad to the second dummy gate of the SOI_PSCR, and a fourth resistor electrically connecting the $V_{DD}$ power terminal to the second gate of the SOI_PSCR;

wherein when appositive-to-$V_{SS}$ ESD voltage is applied to the I/O pad, the SOI_NSCR is turned on to discharge ESD current to the $V_{SS}$ power terminal, when a negative-to-$V_{SS}$ ESD voltage is applied to the I/O pad, the first diode is turned on to discharge ESD current to the $V_{SS}$ power terminal, when a negative-to-$V_{DD}$ ESD voltage is applied to the I/O pad, the SOI-PSCR is turned on to discharge ESD current to the $V_{DD}$ power terminal, when a positive-to-$V_{DD}$ ESD voltage is applied to the I/O pad, the second diode is turned on to discharge ESD current to the $V_{DD}$ power terminal, and when the ESD protection circuit is under a normal operating mode, the SOI-PSCR, the SOI-NSCR, the first diode and the second diode are all turned off.

* * * * *